United States Patent
Smith et al.

(10) Patent No.: US 9,624,898 B2
(45) Date of Patent: Apr. 18, 2017

(54) COMPACT ELECTROMAGNETIC PLASMA IGNITION DEVICE

(71) Applicant: West Virginia University, Morgantown, WV (US)

(72) Inventors: James E. Smith, Bruceton Mills, WV (US); Franz A. Pertl, Morgantown, WV (US)

(73) Assignee: WEST VIRGINIA UNIVERSITY, Morgantown, WV (US)

( * ) Notice: Subject to any disclaimer, the term of this patent is extended or adjusted under 35 U.S.C. 154(b) by 185 days.

(21) Appl. No.: 14/273,583

(22) Filed: May 9, 2014

(65) Prior Publication Data

US 2014/0327357 A1  Nov. 6, 2014

Related U.S. Application Data

(60) Division of application No. 12/756,920, filed on Apr. 8, 2010, now Pat. No. 8,887,683, which is a
(Continued)

(51) Int. Cl.
*F02P 23/00* (2006.01)
*H01T 19/00* (2006.01)
(Continued)

(52) U.S. Cl.
CPC ............. *F02P 9/007* (2013.01); *F02P 23/045* (2013.01); *H01J 37/32091* (2013.01); *H01T 13/50* (2013.01); *F02P 3/01* (2013.01)

(58) Field of Classification Search
CPC .... F02M 27/04; F02M 27/042; F02M 23/001; F02P 23/00; F02P 23/04; F02P 23/045;
(Continued)

(56) References Cited

U.S. PATENT DOCUMENTS 2,652,475 A * 9/1953 Spencer ................. B23K 28/02
                                                     219/121.45
4,611,108 A * 9/1986 Leprince ................. H05H 1/30
                                                     219/121.48
(Continued)

OTHER PUBLICATIONS

F.A. Peril and J.E. Smith, Electromagnetic design of a novel microwave internal combustion engine ignition source, the quarter wave coaxial cavity igniter, Jun. 12, 2009, 14 pages, Proc. IMechE vol. 223 Part D: J. Automobile Engineering, U.S.A.
(Continued)

*Primary Examiner* — Hai Huynh
*Assistant Examiner* — Raza Najmuddin
(74) *Attorney, Agent, or Firm* — Thompson Hine LLP

(57) ABSTRACT

A quarter wave coaxial cavity resonator for producing corona discharge plasma from is presented. The quarter wave coaxial cavity resonator has a folded cavity made of opposing concentric cavity members that are nested together to form a continuous cavity ending in a aperture. A center conductor with a tip is positioned in the cavity. The folded cavity advantageously permits the coaxial cavity resonator to resonate at a lower operating frequency than an unfolded quarter wave coaxial cavity resonator of the same length. Embodiments of the quarter wave coaxial cavity resonator use narrower apertures to reduce radiative losses, and include center conductors that are reactive load elements, such as helical coils. When a radio frequency (RF) oscillation is produced in the quarter wave coaxial cavity resonator, corona discharge plasma is formed at the tip of the center conductor. The corona discharge plasma can be used to ignite combustible materials in combustion chambers of combustion engines.

9 Claims, 18 Drawing Sheets

Related U.S. Application Data continuation-in-part of application No. 12/023,770, filed on Jan. 31, 2008, now Pat. No. 7,721,697.

(51) Int. Cl.
| | | |
|---|---|---|
| *F02P 9/00* | (2006.01) | |
| *F02P 23/04* | (2006.01) | |
| *H01T 13/50* | (2006.01) | |
| *H01J 37/32* | (2006.01) | |
| *F02P 3/01* | (2006.01) | |

(58) Field of Classification Search
CPC .......... F02P 3/011; F02P 3/045; F02P 9/2007; H01T 13/54; H01T 23/00; F02B 19/00; F02B 1/12; F02B 5/02
USPC ...... 123/143 R, 143 B, 620, 607; 330/4, 4.7, 330/5; 219/121.48, 121.5
See application file for complete search history.

(56) References Cited

U.S. PATENT DOCUMENTS

| | | | | |
|---|---|---|---|---|
| 4,728,910 A * | 3/1988 | Owens | ............ | H05H 1/18 219/693 |
| 5,076,223 A * | 12/1991 | Harden | ............ | H01T 13/50 123/143 B |
| 5,211,142 A * | 5/1993 | Matthews | ............ | H01T 13/50 123/143 B |
| 5,361,737 A * | 11/1994 | Smith | ............ | F02P 23/045 123/143 B |
| 5,549,795 A * | 8/1996 | Gregoire | ............ | C02F 1/4608 204/164 |
| 7,189,939 B2 * | 3/2007 | Lee | ............ | H05H 1/30 204/298.38 |
| 7,271,363 B2 * | 9/2007 | Lee | ............ | H05H 1/24 219/121.36 |
| 8,783,220 B2 * | 7/2014 | Smith | ............ | F02P 23/045 123/143 R |
| 8,920,597 B2 * | 12/2014 | Ramaswamy | ............ | H01J 37/32091 118/723 E |
| 2004/0129241 A1 * | 7/2004 | Freen | ............ | F02C 7/266 123/143 B |
| 2006/0048732 A1 * | 3/2006 | Schmidt | ............ | F02P 23/045 123/143 B |
| 2007/0235417 A1 * | 10/2007 | Kuo | ............ | H05H 1/24 219/121.5 |
| 2009/0120394 A1 * | 5/2009 | Heise | ............ | H01T 13/44 123/143 B |
| 2009/0266325 A1 * | 10/2009 | Kumar | ............ | H01T 13/50 123/143 B |
| 2012/0043023 A1 * | 2/2012 | Ramaswamy | ............ | H01J 37/32091 156/345.44 |
| 2012/0235569 A1 * | 9/2012 | Lee | ............ | H05H 1/46 315/111.41 |
| 2015/0075719 A1 * | 3/2015 | Ramaswamy | ............ | H01J 37/32091 156/345.44 |

OTHER PUBLICATIONS

Dustin L. McIntyre, Gregory J. Thompson and James E. Smith, The Coaxial Cavity Resonator as a RF IC Engine Ignition Source, SAE Technical Paper Series, 2001-01-0987, SAE 2001 World Congress, Mar. 5-8, 2010, 14 pages, The Engineering Society for Advancing Mobility Land Sea Air and Space International, U.S.A.

Franz A. Pertl and James E. Smith, High-Level Modeling of an RF Pulsed Quarter Wave Coaxial Resonator with Potential use as a SI Engine Ignition Source, SAE Technical Paper Series 2008-01-0089, 2008 World Congress, Apr. 14-17, 2008, 7 pages, SAE International.

Jay P. Wilhelm, Franz A. J. Pertl, Patrick Wildfire and James E. Smith, Ignition Energy Testing of the Quarter Wave Coaxial Cavity Resonator with Air-Liquefied-Petroleum-Gas Mixtures, Article, American Institute of Aeronautics and Astronautics 2008-3775, 10 pages.

Andrew D. Lowery, Franz A. Pertl and James E. Smith, Experimental Investigation of Dielectrics for Use in Quarter Wave Coaxial Resonators, SAE Technical Paper Series 2007-01-0256, 2007 World Congress, Apr. 16-19, 2007, 8 pages.

* cited by examiner

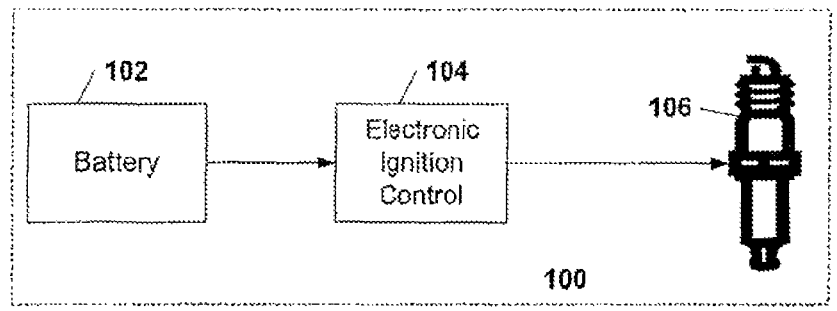
FIG. 1          PRIOR ART
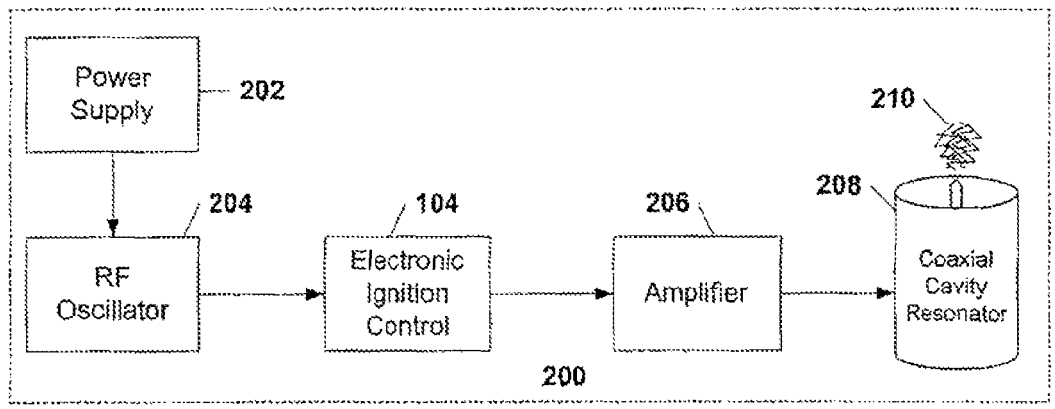
FIG. 2          PRIOR ART

CONTOUR PLOT OF THE RATIO OF INTERNAL TO EXTERNAL STORED ENERGY, $U_{rad}/U$

CONTOUR PLOT OF THE Q/2 FOR BRASS
AT 2.45 GHz, AIR DIELECTRIC

CONTOUR PLOT OF $E_a lN$ (kV cm $W^{-1/2}$)
FOR BRASS AT 2.45 GHz, AIR DIELECTRIC

EXEMPLARY QWCCR DESIGN AND IMPLEMENTATION

COMPACT ELECTROMAGNETIC PLASMA IGNITION DEVICE

CROSS-REFERENCE TO RELATED APPLICATIONS

The present application is a division of U.S. patent application Ser. No. 12/756,920, filed Apr. 8, 2010, entitled "Compact Electromagnetic Plasma Ignition Device," which is a continuation-in-part of U.S. patent application Ser. No. 12/023,770, filed Jan. 31, 2008, entitled "Plasma Generating Ignition System and Associated Method," now U.S. Pat. No. 7,721,697. The present application is further related to U.S. patent application Ser. No. 12/721,231 filed Mar. 10, 2010, entitled "Quarter Wave Coaxial Cavity Igniter for Combustion Engines," which also is a continuation-in-part of U.S. patent application Ser. No. 12/023,770 filed Jan. 31, 2008, entitled "Plasma Generating Ignition System and Associated Method," now U.S. Pat. No. 7,721,697, and which claims the benefit of priority of Provisional U.S. Patent Application Ser. No. 61/159,004, filed Mar. 10, 2009, entitled "Quarter Wave Coaxial Cavity Igniter for Combustion Engines." These related applications are all incorporated herein by reference in their entireties.

TECHNICAL FIELD

Embodiments of the present disclosure relate generally to systems, devices, and methods for using a quarter wave coaxial cavity resonator as an ignition source for a combustion engine.

BACKGROUND OF THE INVENTION

There are two basic methods used to ignite combustion mixtures. Auto ignition through compression and spark ignition. Today a very large number of spark ignited (SI) engines are in use, consuming a limited fossil fuel supply. A significant environmental and economic benefit is obtained by making combustion engines more efficient. Higher thermal efficiencies for SI engines are obtained through operation with leaner fuel air mixtures and through operations at higher power densities and pressures. Unfortunately, as mixtures are leaned, they become more difficult to ignite and combust. More energetic sparks with larger surfaces are required for reliable operation, for example using multiple spark plugs per cylinder systems or rail-plug igniters. As more energetic sparks are used, their overall ignition efficiency is reduced because the higher energy levels are detrimental to the spark plug lifetime. These higher energy levels also contribute to the formation of undesirable pollutants. Therefore it would be desirable to have a spark plug capable of igniting leaner fuel air mixtures than traditional spark ignition sources.

Plasma ignition sources provide an alternative to traditional spark ignition and opens the door to more efficient, leaner and cleaner combustion resulting in associated economic and environmental benefits. Prior art methods and apparatuses describe using plasma as an ignition means for combustion engines. One method of generating plasma involves using a radio frequency (RF) source and a quarter wave coaxial cavity resonator to generate corona discharge plasma. The prior art uses a radio frequency (RF) oscillator and amplifier to generate the required RF power at a desired frequency. RF oscillators and amplifiers can be either semiconductor or electron tube based, and are well known in the art. The RF oscillator and amplifier are coupled to the quarter wave coaxial cavity resonator, which in turn develops a standing RF wave in the cavity at the frequency determined by the RF oscillator. By electrically shorting the input end of the quarter wave coaxial cavity resonator and leaving the other end electrically open, the RF energy is resonantly stepped-up in the cavity to produce a corona discharge plasma at the open end of the quarter wave coaxial cavity resonator. The corona discharge plasma can function generally as an ignition means for combustible materials and specifically in a combustion chamber of a combustion engine.

A quarter wave coaxial cavity resonator is designed to have an electrical length that is approximately one-quarter of the radio frequency delivered from the RF oscillator and amplifier, although cavities that are multiples of one-quarter of the radio frequency will also work. The electrical length of the quarter wave coaxial cavity resonator depends upon the physical geometry of the cavity, the temperature, pressure and environment at the open end of the cavity, as well was whether one or more dielectrics are used to plug or seal the end of the cavity.

Energy consumption is minimized and the corona discharge is maximized when the quarter wave coaxial cavity resonator and radio frequency are appropriately matched. However, the cavity still generates a corona discharge plasma for a range of frequencies around the optimal frequency as well as at higher harmonics of the optimal frequency. An unmatched quarter wave coaxial cavity resonator generally results in lower efficiencies and less power being delivered to the quarter wave coaxial cavity resonator and therefore potentially less corona discharge plasma. When the corona discharge plasma is used as an ignition source for a combustion chamber, a reduction in the amount or strength of the corona discharge plasma is undesirable as it could result in non-ignition of combustible materials in the combustion chamber. Therefore, it is best to closely match the generated radio frequency to the quarter wave coaxial cavity resonator to maximize energy efficiency and maximize corona discharge plasma generation.

However, in practice, the resonant frequency of a quarter wave coaxial cavity resonator may not be optimally matched with the RF oscillator and amplifier. This can occur for any number of reasons, including improper selection of frequency in the RF oscillator, mechanical fatigue and wearing of the quarter wave coaxial cavity resonator or dielectric, or even transient changes in the resonant frequency of the quarter wave coaxial cavity resonator due to, for example, the formation of the corona discharge plasma itself or other changes in the environment near the region of the cavity. Therefore, it is desired that the RF oscillation be dynamically generated and modulated in such a way that it is closer to the resonant frequency of the quarter wave coaxial cavity resonator in order to attain the optimal frequency for corona discharge plasma generation.

Also, the prior art systems and apparatuses that describe systems, devices, and methods for using plasma as an ignition means in a combustion engine generally require redesign of electronic ignition control systems, the fuel injection systems, or even the combustion chambers of the engines themselves to function. Therefore, there exists a need for a corona discharge plasma ignition device that can function as a replacement for a spark plug in an internal combustion engine without requiring substantial modification to the engine, ignition control system or associated connections and circuitry.

Further, to use a plasma ignition device in place of a spark plug may require that the device be approximately the same size and geometry as an existing spark plug. Because most spark plugs are small, just several centimeters, the plasma ignition device must use very high frequencies to develop standing waves in a similarly sized package. Higher frequencies generally require more expensive power supplies and conduction losses generally increase as frequencies increase. Losses require more robust power supplies, further increasing expenses and make the plasma ignition device more prone to failures due to insufficient power. Therefore there exists a need for a plasma ignition device that uses energy more efficiently or uses lower frequencies.

SUMMARY OF THE INVENTION

The present disclosure meets the above and other needs. A quarter wave coaxial cavity resonator (QWCCR) is adapted to operate in the next generation of lean high efficiency internal combustion engines. In embodiments, the QWCCR comprises a folded cavity that permits the use of lower operating frequencies than an unfolded cavity of comparable length. In embodiments, the QWCCR comprises a reduced aperture geometry that reduces the amount of aperture radiation that is lost through the open end. In embodiments, the QWCCR comprises a reactive load center conductor to decrease the necessary operating frequency for a given cavity length and boost the amount of stored energy in the QWCCR. In embodiments, the QWCCR is adapted to mate with the combustion chamber of a combustion engine.

BRIEF DESCRIPTION OF THE DRAWINGS

The accompanying figures depict multiple embodiments of the compact electromagnetic plasma ignition device. A brief description of each figure is provided below. Elements with the same reference numbers in each figure indicate identical or functionally similar elements. Additionally, as a convenience, the left-most digit(s) of a reference number identifies the drawings in which the reference number first appears.

FIG. 1 is a schematic diagram of a prior art ignition system using a spark plug as an ignition source.

FIG. 2 is a schematic diagram of a prior art ignition system using a coaxial cavity resonator as an ignition source.

DETAILED DESCRIPTION

Figure 3:
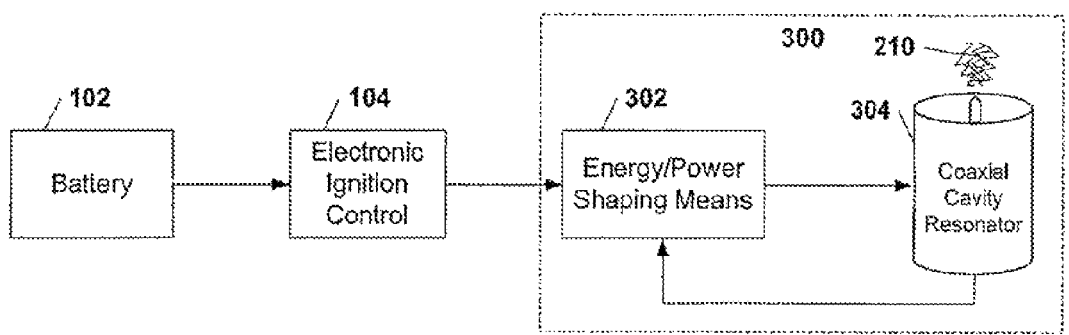
FIG. 3 is a schematic diagram of an embodiment of the invention where the coaxial cavity resonator is used as a frequency determining element.

FIG. 1 and FIG. 2 detail the prior art ignition systems. Exemplary embodiments of the present invention are detailed in FIGS. 3-25.

Prior Art Ignition System with a Spark Plug

Referring now to the schematic diagram of a prior art ignition system 100 depicted in FIG. 1, a battery 102 connects to an electronic ignition control system 104 which is connected by a spark plug wire to the terminal end of a spark plug 106.

In a typical prior art ignition system 100, like that found in an automobile, a battery 102 provides electrical power to an electronic ignition control system 104. The electronic ignition control system 104 determines the proper timing for triggering an ignition event, and at the appropriate time sends a high voltage pulse via a spark plug wire to the terminal end of a spark plug 106. The high voltage pulse causes a spark to discharge at the tip of the spark plug 106 that is displaced inside of a combustion chamber (not shown). The spark ignites combustible material, such as gasoline vapor, that is inside the combustion chamber of a combustion engine, completing the ignition sequence.

Prior Art Ignition System with a Stand-Alone Coaxial Cavity Resonator

Referring now to the schematic diagram of a prior art coaxial cavity resonator ignition system 200 depicted in FIG. 2, a power supply 202 connects to a radio frequency (RF) oscillator 204 that is connected through an electronic ignition control system 104 to an amplifier 206 that is connected to a stand-alone coaxial cavity resonator 208. An exemplary system using a stand-alone coaxial cavity resonator 208 is described in U.S. Pat. No. 5,361,737 to Smith et al. herein incorporated by reference. A coaxial cavity resonator may also be referred to as a quarter wave coaxial cavity resonator.

In the prior art coaxial cavity resonator ignition system 200, the power supply 202 provides electrical power to an RF oscillator 204. The RF oscillator 204 generates an RF signal at a frequency chosen to approximate the resonant frequency of the stand-alone coaxial cavity resonator 208. The RF oscillator 204 delivers the RF signal to an electronic ignition control system 104 that determines the proper timing for triggering an ignition event, and at the appropriate time forwards the RF signal to the amplifier 206 for amplification. The amplifier 206 amplifies the RF signal to the proper power to create sufficiently energetic corona discharge plasma 210 at the discharge tip of the stand-alone coaxial cavity resonator 208 to ignite a combustible material in the combustion chamber of a combustion engine.

Self-Oscillating Coaxial Cavity Resonator Ignition System

Referring now to an embodiment of the present disclosure depicted in FIG. 3, a battery 102 connects to an electronic ignition control system 104 which is connected to a power shaping means 302. The power shaping means 302 is operably connected to a coaxial cavity resonator 304 such that the power shaping means 302 and the coaxial cavity resonator 304 are in a feedback loop with one another to form a self-oscillating coaxial cavity resonator ignition system 300.

In the embodiment of FIG. 3, the battery 102 is a standard battery such as that found in an automobile or any other convenient power source as would be understood in the art, including but not limited to an alternator, a generator, a solar cell, or fuel cell. The battery 102 powers the electronic ignition control system 104. The electronic ignition control system 104 outputs an impulse, e.g., a high voltage pulse, at the appropriate time to trigger ignition. The power shaping means 302 accepts the impulse, e.g., the high voltage pulse through a spark plug wire, from the electronic ignition control system 104. Parasitically using only the power supplied in the impulse from the electronic ignition control system 104, the power shaping means 302 regulates, amplifies, or generates the necessary electrical voltage, amplitude, and time-varying characteristics of the electrical waveform output to the coaxial cavity resonator 304. Because the power shaping means 302 varies the electrical waveform in a "time-varying" manner, the power shaping means 302 is also called an energy shaping means; energy being the rate at which power is expended. Thus power shaping means 302 and energy shaping means may be used interchangeably in this disclosure. The term waveform in the various embodiments disclosed herein is meant to encompass any suitable electrical or electromagnetic power whose time varying characteristics help create the RF oscillations as would be understood by one of ordinary skill in the art, including but not limited to, one or more high-voltage DC electrical pulses, an amplified AC signal, or RF energy delivered by waveguide.

Together, the power shaping means 302 and the coaxial cavity resonator 304 form a self-oscillating coaxial cavity resonator ignition system 300 and develop a sustained RF oscillation, or time limited RF oscillation such as an RF pulse, that is close to or at the resonant frequency of the coaxial cavity resonator 304 which results in optimal corona discharge plasma 210 generation. In one embodiment, the duration of the sustained RF oscillation is a short period ignition pulse as would be used for internal combustion engines such as those used in automobiles. In another embodiment, the duration of the sustained RF oscillation is approximately continuous, generating corona discharge plasma 210 during the period of engine operation, as in the case of a jet engine.

The power shaping means 302 is any electrical circuitry capable of creating an RF oscillation in conjunction with the coaxial cavity resonator 304, without requiring a separate RF oscillator, to generate corona discharge plasma 210. In different embodiments, the power shaping means 302 comprises various combinations of electron tubes or electron drift tubes, examples of which are traveling wave tubes or Magnetrons, Amplitrons, semiconductors including negative resistance devices, inductive or capacitive elements, or spark gaps. As is known in the art, various devices and circuit designs are capable of triggering, amplifying, and maintaining RF oscillations indefinitely or for a limited time period. By using the coaxial cavity resonator 304 as part of a frequency determining circuitry, the frequency of the oscillation is made to more closely approximate the resonant frequency of the coaxial cavity resonator 304.

In an exemplary embodiment, the RF oscillations are between about 750 MHz and 7.5 GHz. A coaxial cavity resonator 304 measuring between 1 to 10 cm long approximately corresponds to an operating frequency in the range of 750 Mhz to 7.5 Ghz. The advantage of generating frequencies in this range is that it allows the geometry of a body containing the coaxial cavity resonator 304 to be dimensioned approximately the size of the prior art spark plug 106.

In one embodiment of the self-oscillating coaxial cavity resonator ignition system 300 in FIG. 3, and in other embodiments described later in FIGS. 4-13, the power shaping means 302 and the coaxial cavity resonator 304 are contained in a body dimensioned approximately the size of the prior art spark plug 106 and adapted to mate with the combustion chamber of a combustion engine (not shown). In another embodiment, the body is a modified prior art spark plug 106 body comprised of steel or other metals. A connection terminal (not shown) on the body approximating that of the prior art spark plug 106 accepts a spark plug wire from the ignition control system 104. In the embodiment of the invention of FIG. 3, the system 300 is powered solely by the impulse delivered from the ignition control system 104 and therefore can be used as a replacement spark plug 106 without requiring substantial modifications to the engine, ignition system, or associated connections and circuitry. In another embodiment, the coaxial cavity resonator 304 is contained in the body adapted for mating with the combustion chamber and the power shaping means 302 resides outside the body.

Powered Self-Oscillating Coaxial Cavity Resonator Ignition System

Figure 4:
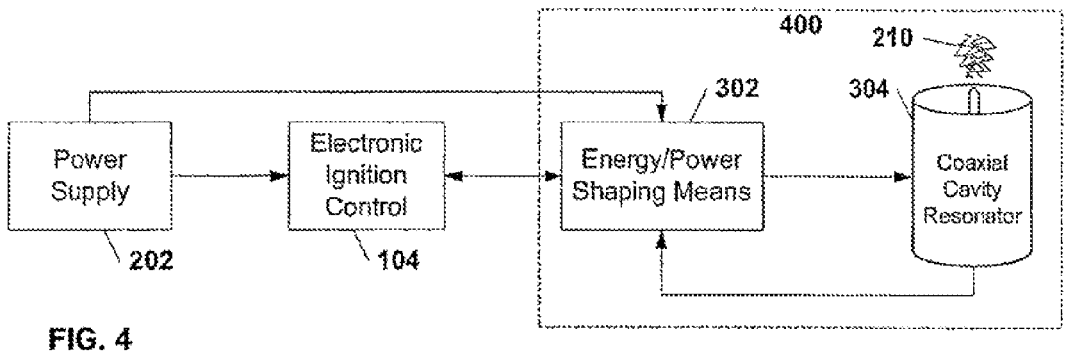
FIG. 4 is a schematic diagram of an alternative embodiment of the invention where the coaxial cavity resonator is used as a frequency determining element and where a power supply delivers additional power to the power shaping means.

Referring now to the embodiment depicted in FIG. 4, a power supply 202 connects to both an electronic ignition control system 104 and the power shaping means 302. The electronic ignition control system 104 is connected to a power shaping means 302. The power shaping means 302 is operably connected to a coaxial cavity resonator 304 such that the power shaping means 302 and the coaxial cavity resonator 304 are in a feedback loop with one another to form a powered self-oscillating coaxial cavity resonator ignition system 400.

FIG. 4 is similar to FIG. 3 but has a power supply 202 that replaces the battery 102 of FIG. 3, and the power supply is electrically connected to the power shaping means 302. Because the power supply 202 provides regulated power to the power shaping means 302, the power shaping means 302 does not have to run parasitically solely from the impulse energy delivered from the electronic ignition control system 104 as in one embodiment detailed in FIG. 3. In a powered self-oscillating coaxial cavity resonator ignition system 400, the regulated power may be used in various embodiments to power negative resistance devices 502 (shown on FIG. 5) or electron tubes. As is generally known in the art, one category of semiconductor devices called negative resistance devices 502, including Gunn diodes, IMPATT diodes, or TRAPATT diodes, can be used to turn direct current (DC) impulses into RF energy. Gunn diodes may also be referred to as a type of transferred electron device (TED). A small offset voltage, or bias, puts the negative resistance device 502 into the proper operating range for having the characteristic negative resistance necessary for generating RF waveforms. When a negative resistance device or electron tube is matched to a resonator, for example a coaxial cavity resonator 304, and given an additional pulsed electrical stimulus, the negative resistance device 502 or electron tube and coaxial cavity resonator 304 together generate the desired RF waveform, thus forming a powered self-oscillating coaxial cavity resonator ignition system 400.

In the embodiment of FIG. 4, feedback from the power shaping means 302 and coaxial cavity resonator 304 is coupled back to the electronic ignition control system 104 for on-board diagnostics as well as control of other engine functions such as fuel flow, ignition advance, emission control and other systems as would be obvious to one having ordinary skill in the art.

In an alternative embodiment of a powered self-oscillating coaxial cavity resonator ignition system 400, the regulated power powers an RF amplifier in the power shaping means 302 for generating more energetic corona discharge plasma 210. For example, a suitable field effect transistor (FET), HEMT, MMIC or other semiconductor amplifier capable of operating in the RF spectrum is used along with a simple probe 902 or pickup loop 1002 as a feedback mechanism in making an RF oscillator. More energetic corona discharge plasma 210 allows easier ignition of a wider range of combustible materials. In yet another embodiment, the regulated power supports a power shaping means 302 with additional circuitry to allow the electronic ignition control system 104 to utilize low voltage signals or even data transmissions to initiate an ignition sequence, instead of the standard high voltage impulses used in most ignition systems today.

Coaxial Cavity Resonator with Negative Resistance Device

Figure 5:
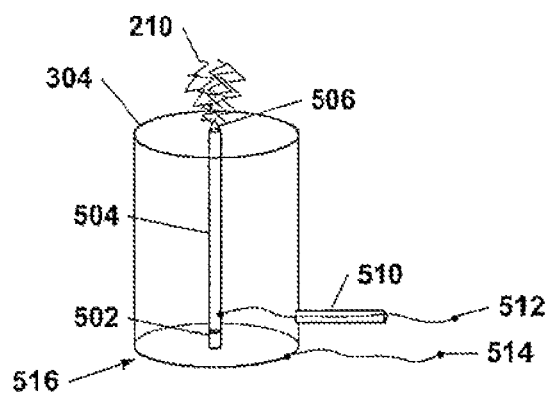
FIG. 5 is a cross-sectional view of one embodiment of the coaxial cavity resonator where the power shaping means comprises a negative resistance device that is integrated into the center conductor of the coaxial cavity resonator.

Referring now to the embodiment of the coaxial cavity resonator 304 depicted in FIG. 5, a power feed wire 512 enters the coaxial cavity resonator 304 through an insulated guide 510, and attaches to the suspended center conductor 504. The insulated guide 510 prevents contact between the power feed wire 512 and the coaxial cavity resonator 304. The insulated guide 510 terminates at the wall of the coaxial cavity resonator 304 near the base 516. In alternate embodiments, the insulated guide 510 extends into the coaxial cavity resonator 304. In alternate embodiments, the power feed wire 512 enters into the coaxial cavity resonator 304 through the base 516. In an alternate embodiment, the power feed wire 512 extends into the coaxial cavity resonator 304 without an insulated guide 510.

The suspended center conductor 504 is suspended above the base 516 of the coaxial cavity resonator 304 by physical contact with a negative resistance device 502, by filling the internal cavity of the coaxial cavity resonator 304 with a supporting dielectric (not shown), or by any other supporting means as known in the art. At one end, the proximal end, the suspended center conductor 504 is electrically connected to the negative resistance device 502 near the base 516. At the other end, the distal end, the suspended center conductor 504 has a discharge electrode 506 where the corona discharge plasma 210 is generated. The negative resistance device 502 is electrically connected to the base 516 of the coaxial cavity resonator 304. An electrical return path 514 attaches directly to the coaxial cavity resonator 304. In an alternative embodiment, the negative resistance device 502 is physically raised from the base 516 of the coaxial cavity resonator 304 on a bottom stub of the center conductor 504. In alternate embodiments, the negative resistance device 504 is positioned anywhere along length of the center conductor 504 between the base 516 and the discharge electrode 506. In alternate embodiments, the negative resistance device 502 is electrically connected to the wall of the coaxial cavity resonator 304 instead of the base 516. In an alternate embodiment, the negative resistance device 502 is electrically connected to the electrical return path 514.

The power feed wire 512 delivers both a small direct current (DC) bias and an electrical impulse to the suspended center conductor 504. The power feed wire 512 is insulated from the rest of the coaxial cavity resonator 304 by the insulated guide 510. The DC bias delivered by the power feed wire 512 is conducted through the suspended center conductor 504 to the negative resistance device 502. The DC bias puts the negative resistance device 502 in the proper operating range for having the characteristic negative resistance necessary for generating RF waveforms. The electrical return path 514 completes the DC electrical circuit, allowing proper DC biasing of the negative resistance device 502. The electrical impulse, also delivered on the power feed wire 512, then starts the RF oscillation between the negative resistance device 502 and coaxial cavity resonator 304. The RF oscillation creates a standing wave in the coaxial cavity resonator 304, resulting in corona discharge plasma 210 being generated at the discharge electrode 506. The discharge electrode 506 is formed from or coated with a metal or semi-metallic conductor, for example stainless steel, that can withstand the temperature conditions near the corona discharge plasma 210 without deformation, oxidation, or loss.

Coaxial Cavity Resonator with Spark Gap

Figure 6:
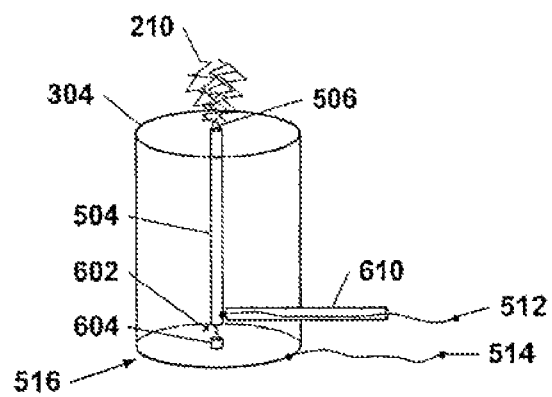
FIG. 6 is a cross-sectional view of an alternate embodiment of the coaxial cavity resonator where the power shaping means comprises a spark gap that is integrated into the center conductor of the coaxial cavity resonator.

Referring now to the embodiment of the coaxial cavity resonator 304 depicted in FIG. 6, a power feed wire 512 enters the coaxial cavity resonator 304 through an extended insulated guide 610, and attaches to the suspended center conductor 504. The extended insulated guide 610 prevents contact between the power feed wire 512 and the coaxial cavity resonator 304 The suspended center conductor 504 is suspended above the base 516 of the coaxial cavity resonator 304 by physical contact with the extended insulated guide 610. In alternative embodiments, the suspended center conductor 504 is suspended by filling the internal cavity of the coaxial cavity resonator 304 with a supporting dielectric (not shown), or by any other supporting means as known in the art. In alternate embodiments, the extended insulated guide 610 is an insulated guide 510 and does not extend into the coaxial cavity resonator 304. In alternate embodiments, the extended insulated guide 610 contacts the suspended center conductor 504 anywhere along the length of the suspended center conductor 504 up to the discharge tip 506. In alternate embodiments, the power feed wire 512 enters into the coaxial cavity resonator 304 through the base 516.

At one end, the proximal end, the suspended center conductor 504 has an electrically open spark gap 602 near the base 516. At the other end, the distal end, the suspended center conductor 504 has a discharge electrode 506 where the corona discharge plasma 210 is generated. On the base 516 side of the spark gap 602 is a slightly raised bottom stub center conductor 604. An electrical return path 514 also attaches to the coaxial cavity resonator 304. In an alternate embodiment, the spark gap 602 is positioned anywhere along the length of the center conductor 504 between the base 516 and the discharge electrode 506. In an alternative embodiment, the spark gap 602 is between the suspended center conductor 504 and the base 516.

The power feed wire 512 delivers an electrical impulse to the suspended center conductor 504. The power feed wire 512 is insulated from the rest of the coaxial cavity resonator 304 by the extended insulated guide 610 that extends into the cavity of the coaxial cavity resonator 304. The electrical impulses necessary for the generation of RF waveforms require short pulses with sharp rise-times, and the center conductor 504 and the stub center conductor 604 on either side of the spark gap 602 are constructed to withstand the possible erosion due to these sparks. The electrical impulses trigger sparks to arc across the spark gap 602, ringing the coaxial cavity resonator 304 and triggering RF oscillations which then form standing waves in the coaxial cavity resonator 304. The resonating standing waves in the coaxial cavity resonator 304 result in corona discharge plasma 210 being generated at the discharge electrode 506.

Figure 7:
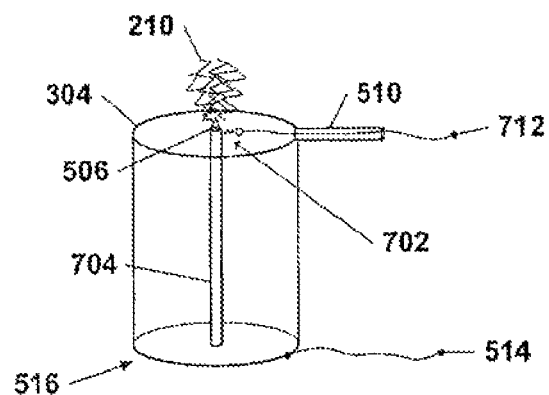
FIG. 7 is a cross-sectional view of an alternate embodiment of the coaxial cavity resonator where the power shaping means comprises a spark gap that is near the top of the center conductor of the coaxial cavity resonator.
Figure 8:
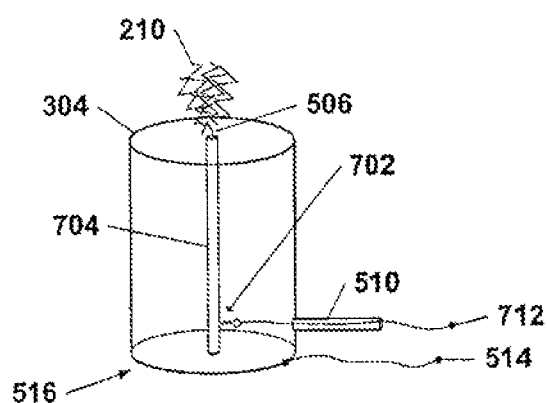
FIG. 8 is a cross-sectional view of an alternate embodiment of the coaxial cavity resonator where the power shaping means comprises a spark gap near the base of the center conductor of the coaxial cavity resonator.

Referring now to the embodiments of the coaxial cavity resonator 304 depicted in FIGS. 7 and 8, a spark wire 712 enters the coaxial cavity resonator 304 through an insulated guide 510, and creates an electrically open wire spark gap 702 with the center conductor 704. The center conductor 704 is attached to the base 516 of the coaxial cavity resonator 304. The center conductor 704 has a discharge electrode 506 at the distal end of the coaxial cavity resonator 304. An electrical return path 514 also attaches to the coaxial cavity resonator 304.

FIGS. 7 and 8 differ only in the location of the spark wire 712 and insulated guide 510, and function similarly to embodiment depicted in FIG. 6. The spark wire 712 allows an electrical impulse to arc across the wire spark gap 702 to the center conductor 704. The spark wire 712 is insulated from the rest of the coaxial cavity resonator 304 by the insulated guide 510 that also may extend into the cavity of the coaxial cavity resonator 304 similar to the extended insulated guide 610 of FIG. 6 (not shown).

In alternate embodiments, the internal cavity 1404 of the coaxial cavity resonator 304 is filled with a dielectric (shown in FIG. 14b and FIG. 14c) that does not prevent a spark from bridging the spark gap 602 or wire spark gap 702. In an alternate embodiment, the spark gap 602 is between the suspended center conductor 504 and the wall of the coaxial cavity resonator 304. In an alternate embodiment, the wire spark gap 702 is between the suspended center conductor 504 and the electrical return path 514. Various other loca- tions and arrangements for the spark gap 602 and wire spark gap 702 are possible and would be obvious to one having skill in the art. The above figures and descriptions represent merely exemplary embodiments of the invention.

Coaxial Cavity Resonator with Feedback Sense

Figure 9:
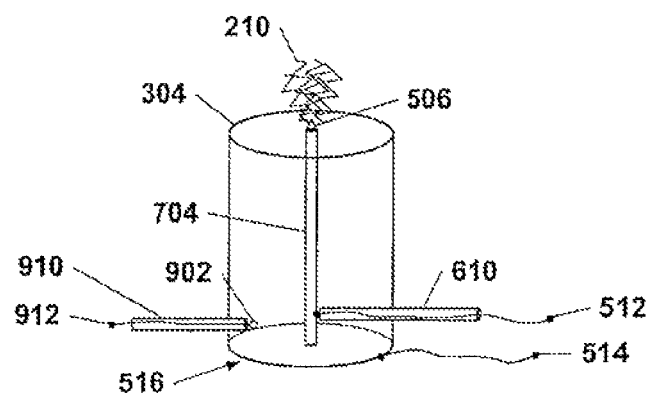
FIG. 9 is a cross-sectional view of an alternate embodiment of the coaxial cavity resonator with a simple probe providing an electrical feedback sense.
Figure 10:
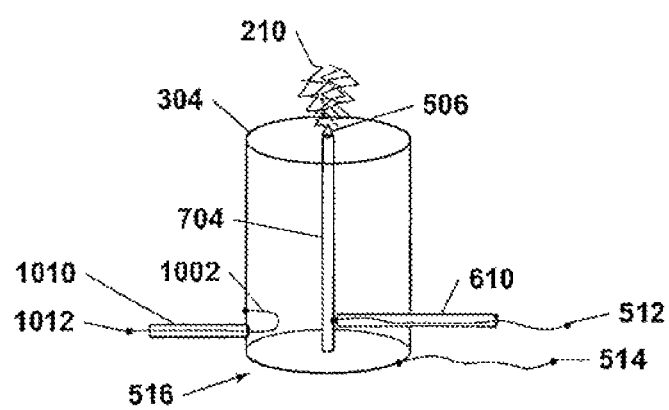
FIG. 10 is a cross-sectional view of an alternate embodiment of the coaxial cavity resonator with a loop pickup providing an electrical feedback sense.

Referring now to the embodiments of the coaxial cavity resonator 304 depicted in FIGS. 9 and 10, a power feed wire 512 enters the coaxial cavity resonator 304 through an extended insulated guide 610, and attaches to the center conductor 704. The center conductor 704 is attached to the base 516 of the coaxial cavity resonator 304 and the internal cavity of the coaxial cavity resonator 304 may be filled with a dielectric (not shown). The center conductor 704 has a discharge electrode 506 at the open end of the coaxial cavity resonator 304. An electrical return path 514 also attaches to the coaxial cavity resonator 304. FIG. 9 depicts a simple probe 912 with an insulated probe guide 910 that extends into the coaxial cavity resonator 304 and has an open ended probe tip 902 that extends through the insulated probe guide 910 further into the coaxial cavity resonator 304. FIG. 10 depicts a pickup loop 1012 with an insulated loop guide 1010 that allows a wire loop 1002 to extend into the coaxial cavity resonator 304 and attach to an inner surface of the coaxial cavity resonator 304. In an alternate embodiment, a probe 902 is used as a power feed instead of the directly connected power feed wire 512. In an alternate embodiment, a wire loop 1002 is used as a power feed instead of the directly connected power feed wire 512.

Figure 11:
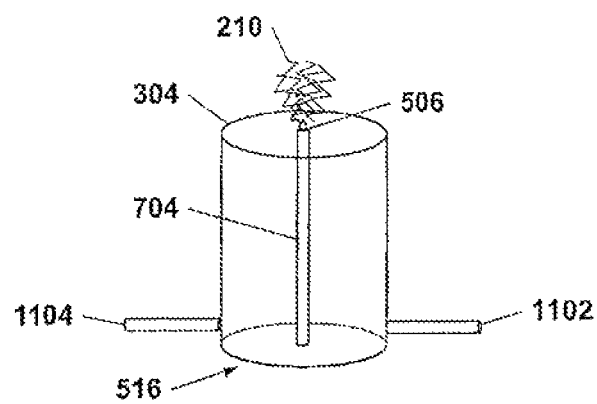
FIG. 11 is a cross-sectional view of an alternate embodiment of the coaxial cavity resonator with separate waveguides providing power and an electrical feedback sense.
Figure 12:
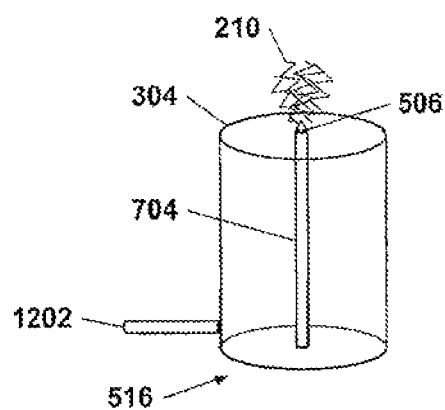
FIG. 12 is a cross-sectional view of an alternate embodiment of the coaxial cavity resonator with a common waveguide providing power and an electrical feedback sense.

Referring now to the embodiment of the coaxial cavity resonator 304 depicted in FIG. 11, an input waveguide 1102 is coupled to the coaxial cavity resonator 304. The input waveguide 1102 couples an electron tube device such as a magnetron, amplitron, traveling wave tube, or other RF amplifier to the coaxial cavity resonator 304. A feedback waveguide 1104 provides feedback to the magnetron, traveling wave tube, or other RF amplifier. Referring now to the embodiment of the coaxial cavity resonator 304 depicted in FIG. 12, a waveguide 1202 is coupled to the coaxial cavity resonator 304, similar to FIG. 11, but utilizing the waveguide 1202 for both transferring power to the coaxial cavity resonator 304 and providing a feedback signal.

Figure 13:
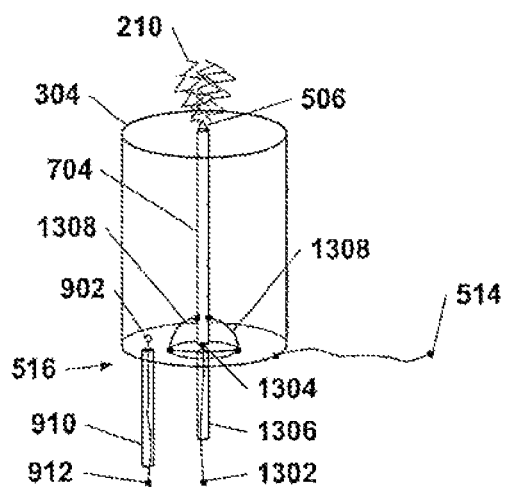
FIG. 13 is a cross-sectional view of an alternate embodiment of the coaxial cavity resonator with a power connection entering through the base of the cavity and an electrical feedback sense.

Referring now to the embodiment of the coaxial cavity resonator 304 depicted in FIG. 13, a simple probe 912 with an open ended probe tip 902 extends through the insulated probe guide 910 into the base 516 of the coaxial cavity resonator 304 as a feedback sense. An RF cable 1302 connects to the base 516 of the coaxial cavity resonator 304 and the RF cable center wire 1304 is electrically connected to the center conductor 704. One or more loops 1308 used to energize the coaxial cavity resonator 304 are displaced further along the center conductor 704, and loop back to the RF cable shield 1306 and the base 516 of the coaxial cavity resonator 304. In alternate embodiments, the simple probe 912 and RF cable 1302 are placed at any convenient location on the coaxial cavity resonator 304 as would be understood by one of ordinary skill in the art. In alternate embodiments, various combinations of simple probes 912, pickup loops 1012, waveguides 1202, and feedback waveguides 1104 and direct electrical coupling are used to energize the coaxial cavity resonator 304, provide a feedback sense, or both, as would be understood by one of ordinary skill in the art.

A direct electrical coupling, a simple probe 912, a pickup loop 1012, a waveguide 1202, or a feedback waveguide 1104 provide a feedback sense back to the power shaping means 302 (not shown) for sensing the electrical oscillations in the coaxial cavity resonator 304. The power shaping means 302 uses this electrical feedback as input to frequency determining circuitry resulting in the frequency of the oscillations more closely approximating the resonant frequency of the coaxial cavity resonator 304. Direct electrical couplings, simple probes 912, pickup loops 1012, waveguides 1202, and feedback waveguides 1104 are well known in the art for use with RF cavity resonators, as are other suitable feedback devices that would be obvious to one having ordinary skill in the art.

Coaxial Cavity Resonator

Figures 14A, 14B, 14C:
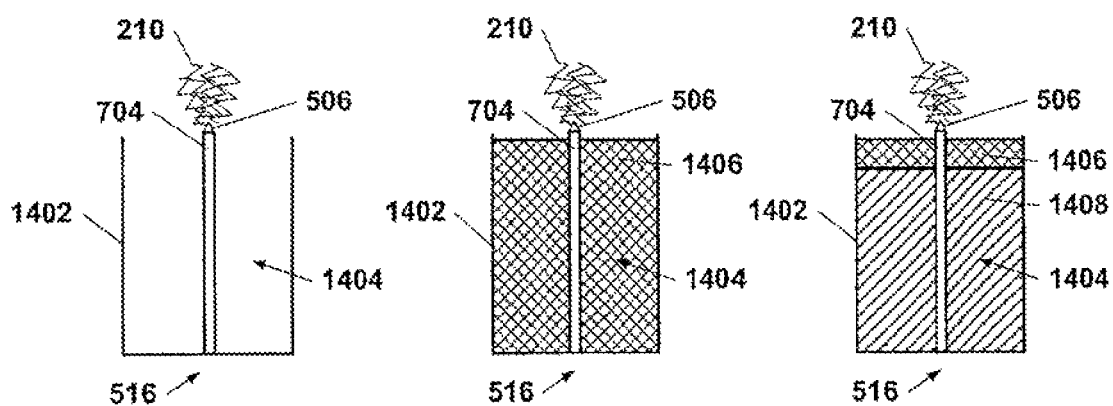
FIGS. 14a, 14b and 14c are cutaway views of embodiments of the coaxial cavity resonator having an empty cavity, a filled or partially filled cavity, and a sealed cavity.

Referring now to FIGS. 14a, 14b, and 14c, in alternate embodiments the center conductor 704 and cavity wall 1402 of the coaxial cavity resonator 304 are each comprised of a material taken from the group of copper, brass, steel, platinum, silver, aluminum, or other good electrical conductors in order to provide high conductivity and low power absorption in the coaxial cavity resonator 304. Referring to FIG. 14a, in one embodiment of the coaxial cavity resonator 304 the cavity wall 1402 defines a cavity 1404 having a hollow interior region. Referring to FIG. 14b, in another embodiment, the cavity 1404 of the coaxial cavity resonator 304 is filled or partially filled with one or more solid materials 1406 including, but not limited to, low electrical loss and nonporous ceramic dielectric materials, such as ones selected from the group consisting of: aluminum oxide, silicon oxide, glass-mica, magnesium oxide, calcium oxide, barium oxide, magnesium silicate, alumina silicate, and boron nitride, to create a solid plug in the cavity. The solid materials 1406 form a plug in the coaxial cavity resonator 304 thereby minimizing physical perturbation of the combustion chamber and also minimizing electrical perturbation of the coaxial cavity resonator 304 by materials from the combustion chamber. Referring to FIG. 14c, in another embodiment, the cavity 1404 of the coaxial cavity resonator 304 is filled with other suitable dielectric materials 1408 as would be known in the art including, but not limited to, a relatively unreactive gas such as nitrogen or argon. The cavity 1404 is then sealed, for example, with one of the aforementioned solid materials 1406, to prevent interaction with the combustion chamber.

Figure 15:
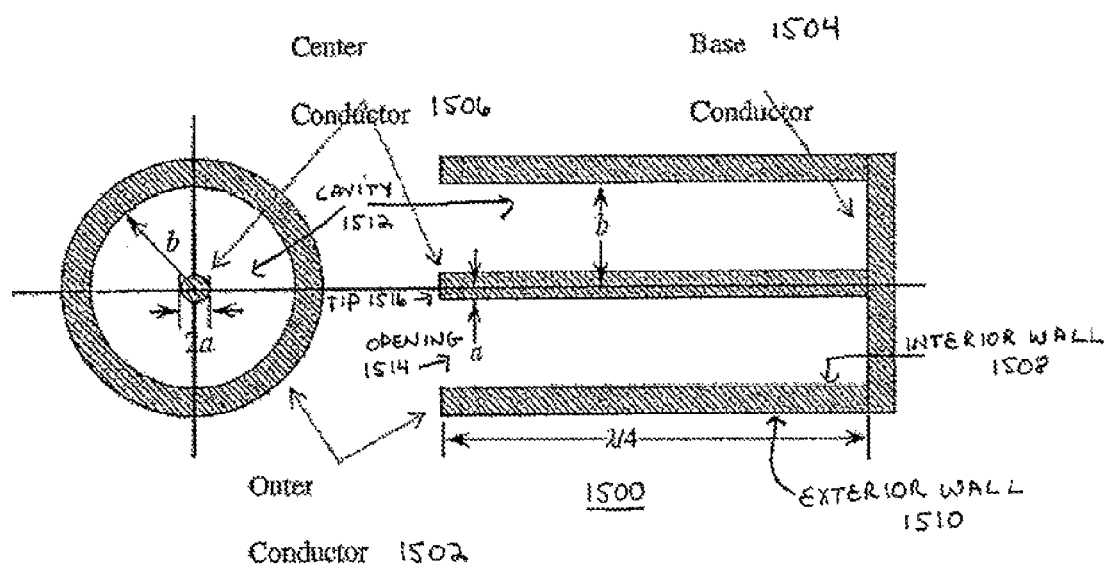
FIG. 15 illustrates a view of an exemplary QWCCR coaxial structure.

Referring now to FIG. 15, a Quarter Wave Coaxial Cavity Resonator, or QWCCR 1500 is shown. The QWCCR 1500 has an outer conductor 1502 having an interior wall 1508 with a radius of dimension b and an exterior wall 1510, a base conductor 1504, and a center conductor 1506 having a radius of a and a diameter of 2a. The center conductor 1506 is also called a center electrode. The center conductor 1506 has a tip 1516. The space between the interior wall 1508 and the center conductor 1506 define a cavity 1512. The QWCCR 1500 has an opening 1514, or aperture, at the end opposite the base conductor 1504. The center conductor 1506 is positioned or disposed within the cavity 1512 and extends from the base conductor 1504 towards the opening 1514. In embodiments, the center conductor 1506 is entirely within the cavity 1512 and does not extend beyond the opening 1514. In embodiments, the center conductor 1506 or the tip 1516 are at, or extend beyond, the opening 1514. In embodiments, the center conductor 1506 is positioned equidistant from the interior wall 1508 such that the center conductor 1506 extends through the center of the QWCCR 1500. In embodiments, the center conductor 1506 is electrically, electromagnetically, or physically connected to the base conductor 1504.

Plasmas

Plasmas are categorized by their temperature and electron density. Microwave generated plasmas generally are more energetic (5-15 eV electron temperature) than DC (1-2 eV electron temperatures). Unmagnetized, atmospheric pressure microwave plasmas provide higher ionization and dissociation than DC due to their higher electron kinetic energy. Note that plasmas generated at atmospheric and higher pressures are considered high pressure microwave plasmas and are distinct from vacuum chamber plasmas.

The QWCCR 1500 creates microwave plasma by inducing electrical breakdown of a gas mixture surrounding the tip 1516 of the center conductor 1506 using a microwave electric field. The QWCCR 1500 consists of a quarter wavelength resonant coaxial cavity into which electromagnetic energy is coupled resulting in a standing electromagnetic field. This large field induces a break-down in the gaseous medium surrounding the center electrode, or center conductor 1506, creating a plasma discharge at the tip 1516 of the center conductor 1506 as an ignition source.

Microwave and RF Gas Breakdown

The microwave electric field strength required to induce this breakdown is one ignition parameter. Gas electron dynamics govern the behavior of such microwave breakdowns. Other factors include the initial free electron population, electron diffusion, drift, electron attachment and recombination. The initial electron population, created by cosmic rays, photo ionization, radioactivity or other mechanisms, seeds the exponential increase in electrons during the breakdown process. This initial electron population is usually unknown, but the nature of the exponential breakdown is not very different for wide ranges of initial electron population densities.

During ionization, collisions of sufficiently energetic electrons with neutral particles or ions create additional electrons. The creation of electrons is balanced by various electron loss mechanisms. Diffusion is a minor loss mechanism due to its pressure dependence. At high pressures, electrons encounter many obstacles in their path, which inhibit their ability to diffuse, so attachment and recombination are often considered the dominant loss mechanism at pressures where plasmas are mainly collisional. Recombination becomes particularly relevant when significant concentration of ions and electrons are present, such as in already established discharges, and the influence on the initial breakdown parameters is diminished.

The electron energy absorption from an alternating electric field is quantified by defining an effective electric field, $E_{eff}$, that is approximately frequency independent. The compensation removes the phase lag effects of the applied frequency, $\omega$, from the rms field, $E_{rms}$, according to $$E_{eff}^2 = E_{rms}^2 \frac{v_c^2}{\omega^2 + v_c^2} \qquad (1)$$

where $v_c$ is the effective momentum collision frequency of the electrons and neutral particles. This effective field is used to relate well known DC breakdown voltages for various gases to AC breakdown values for uniform fields. A good approximation for air is $v_c \approx 5 \cdot 10^9$ p, where p is the pressure in torr. At atmospheric pressures of 760 torr and above, excitations below 3,000 GHz will fall in the collision dominated plasma domain. This justifies an approximation to the rms breakdown threshold, $E_b$, in V/cm of a uniform microwave field in the collisional regime given by $$E_b \simeq 30 \cdot 297 \frac{p}{T} \qquad (2)$$

where T is the temperature in K.

Electromagnetic Analysis

In embodiments, the microwave and RF gas breakdown equations are used to design a QWCCR 1500 to create an ignition plasma for various pressures and temperatures. Design variables of the QWCCR 1500 include the dielectric losses, and the radiation and conduction losses in the ends of the QWCCR 1500 resonator. The standing quarter wave electromagnetic fields inside the resonator oscillate at a resonant frequency, w, store an energy, U, and dissipate a power, PL. In one embodiment, the QWCCR 1500 coaxial geometry is shown in FIG. 15. The relationships between the geometry and the material properties relate to the quality factor, the input power and the maximum electromagnetic field developed.

Approximate Electromagnetic Field in the QWCCR

Neglecting fringing fields at the open end, the fields at the lowest ¼ wave resonance in the cavity 1512 are transverse electromagnetic (TEM) fields as they exist inside coaxial cables. The quality factor, a measure of the energy storage behavior, is the expression $Q=\beta/(2\alpha)$ of a resonant quarter wave transmission line section, where $\alpha+j\beta$ is the complex valued electromagnetic propagation constant. The fields fall off inversely with the radius, r, from the center. The direction of magnetic field is purely circumferential and the direction of the electric field is purely radial. The magnetic field intensity phasor, H, and the electric field phasor, E, of the standing quarter wave inside the resonator can therefore be expressed as $$H = H_\varphi \cdot \hat{a}_\varphi = \frac{I_0}{2 \cdot \pi \cdot r} \cdot \cos(\beta \cdot z) \cdot \hat{a}_\varphi, \quad (3)$$

and $$E = E_r \cdot \hat{a}_r = \frac{V_0}{2 \cdot \pi \cdot r} \cdot \sin(\beta \cdot z) \cdot \hat{a}_r. \quad (4)$$

$I_0$ is the peak current at the base conductor 1504 of the cavity, $V_0$ is the magnitude of peak potential, r is the radial distance from the center, z is the axial distance from the base conductor 1504 taken positive toward the open end of the cavity 1512 and $\beta=2\pi/\lambda$ is the wavenumber.

The quality factor, relation to tip electric field, and energy storage.

By definition, $$Q = \frac{\omega \cdot U}{P_L}, \quad (5)$$

where $\omega$ is the angular frequency, U is the time average energy and $P_L$ is the time average power lost. Note, that after an extremely brief initial cavity 1512 ringup during which the fields build up, the power delivered equals the power lost. The square of $V_0$ is proportional to the energy stored, so (5) provides a relation for the developed tip electric field through $$U = \frac{Q \cdot P_L}{\omega} \propto V_0^2. \quad (6)$$

At resonance, the stored energy oscillates between the electric field and the magnetic field. The time average stored energy in the cavity 1512 volume, U, is given by integrating the field volume energy densities resulting in $$U = U_m + U_e = \frac{1}{4} \int_{vol} (\mu |H|^2 + \varepsilon |E|^2), \quad (7)$$

or $$U = \frac{\ln\left(\frac{b}{a}\right) \cdot \lambda}{64 \cdot \pi}(\mu \cdot I_0^2 + \varepsilon \cdot V_0^2) = \frac{\ln\left(\frac{b}{a}\right) \cdot \lambda \cdot \varepsilon \cdot V_0^2}{32 \cdot \pi}, \quad (8)$$

where $\mu$ is the magnetic permeability and $\in$ is the electric permittivity. Since energy storage at resonance in the electric and magnetic fields is equal, $U=2U_m=2U_e$. The ratio of the electric and magnetic field amplitudes, $I_0$ and $V_0$, gives $\eta=\sqrt{\mu/\in}$, the intrinsic impedance of the volume in the cavity 1512. Noting that $\lambda \cdot f=1/\sqrt{\mu \in}$, substitution of equation (8) into equation (5) and solving for $V_0$, the center conductor peak tip potential results in:

$$V_0 = \sqrt{\frac{32 \cdot \pi \cdot Q \cdot P_L}{\omega \cdot \varepsilon \cdot \ln\left(\frac{b}{a}\right) \cdot \lambda}} = 4\sqrt{\frac{\eta \cdot Q \cdot P_L}{\ln\left(\frac{b}{a}\right)}}. \quad (9)$$

The corresponding peak value of the electric field at radius a on the surface of the center conductor 1506, $E_a$, as given by equation (4) is then:

$$E_a = \frac{V_0}{2 \cdot \pi \cdot a} = \frac{2}{\pi \cdot a}\sqrt{\frac{\eta \cdot Q \cdot P_L}{\ln\left(\frac{b}{a}\right)}}. \quad (10)$$

The root mean square of this electric field will have to exceed the breakdown strength given by equation (2). It is clear from equation (10) that to increase the field strength and induce breakdown, a should be made as small as is practical. A higher intrinsic impedance, $\eta$, (lower $\in$, higher $\mu$), more input power, $P_L$, and a higher Q also increase the field strength, but only in the square root. Since Q is a function of the geometry, it will be examined in more detail. Towards this, the power losses in the cavity need to be examined.

Internal Power Losses

The power loss is composed of ohmic losses on the conductor 1502, 1504, 1506 surfaces, $P_\sigma$, dielectric losses, $P_{\sigma e}$, in the cavity 1512 volume, and radiation losses, $P_{rad}$, from the end of the open cavity 1512. The ohmic losses depend on the surface resistance, $R_s=\sqrt{\omega \cdot \mu_c/2 \cdot \sigma_c}$, of the conductors 1502, 1504, 1506 where $\mu_c$ and $\sigma_c$ are the magnetic permeability and the conductivity of the conductor 1502, 1504, 1506. The center conductor, the outer conductor 1502, and the base conductor 1504 power losses, $P_{ctr}$, $P_{out}$, $P_b$, are computed by integrating the ohmic power density over the conductor surfaces, as given by:

$$P_\sigma = \frac{1}{2}\int_A R_s |H_{//}|^2, \quad (11)$$

or $$P_\sigma = P_{ctr} + P_{out} + P_b = \frac{R_s \cdot I_0^2}{4 \cdot \pi}\left[\frac{\lambda}{8 \cdot a} + \frac{\lambda}{8 \cdot b} + \ln\left(\frac{b}{a}\right)\right], \quad (12)$$

where $H_{//}$ is the magnetic field parallel to the surface.

Interaction of matter with the electromagnetic fields can be very complicated, anisotropic, and frequency and temperature dependent. By assuming that a simple isotropic low loss dielectric fills the cavity 1512, the material can be characterized by its dielectric permittivity, $\in$, and its effective loss tangent, $\tan(\delta_e)$. The effective loss tangent represents any conductivity and any alternating molecular dipole losses and are used to calculate an effective dielectric conductivity, $\sigma_e \approx \omega \cdot \in \cdot \tan(\delta_e)$. The power dissipated by an alternating field for a simple low loss dielectric material is expressed by the volume integral, $$P_{\sigma_e} = \frac{1}{2} \int_{vol} \sigma_e |E|^2 = \frac{\sigma_e \cdot \eta^2 \cdot I_0^2}{4 \cdot \pi} \left( \frac{\ln\left(\frac{b}{a}\right) \cdot \lambda}{8} \right). \quad (13)$$

Substitution of the power losses thus far into equation (5) and combining, the an internal quality factor, $Q_{int}$ of the cavity, without considering radiation can then be defined as $$Q_{int} = \qquad (14)$$

$$(Q_{ctr}^{-1} + Q_{out}^{-1} + Q_b^{-1} + Q_{\sigma_e}^{-1})^{-1} = \left( \frac{R_s}{2 \cdot \pi \cdot \eta} \left[ \frac{\left(\frac{b}{a} + 1\right)}{\frac{b}{\lambda} \cdot \ln\left(\frac{b}{a}\right)} + 8 \right] + \tan(\delta_e) \right)^{-1}.$$

Maximizing $Q_{int}$ with respect to the radius ratio, $b/a$, results in the ratio of $b/a=3.59$. This is the same ratio as a half-wave cavity. By examining these components of Q, it becomes apparent that the contribution, $Q_{out}$ of the outer conductor 1502, is greater than the contribution $Q_{ctr}$ of the center conductor 1506 by a factor of $b/a$ given conductivities. This suggest the use of a higher conductivity material for the small amount of metal comprising the center conductor 1506 to increase $Q_{int}$. It can also be shown that the base conductor 1504 and dielectric Q's, $Q_b$, $Q_{oe}$, are unaffected by the geometry (terms $b/a$ and $b/\lambda$).

Up to this point the geometry for a maximum Q, suggests a $b/a=3.59$ and $b/\lambda$ to be as large as feasible, but still below where higher resonance modes appear, around $2\pi(a+b) \cong \lambda$. Any dielectric should have a minimum loss tangent and a low dielectric constant, and conductor 1502, 1504, 1506 surface resistances should be kept as small as feasible. However, the rather significant radiation losses, due to the open aperture end, or opening 1514, still need to be considered.

Radiation Losses and Fringe Field Storage

A simple way to treat the radiation losses is to consider the aperture as admittance. For a coaxial line radiating into open space this admittance is known in the art. For $a \ll \lambda$ and $b \ll \lambda$, the real part, $G_r$, and the imaginary part, $B_r$ is approximated by $$G_r \cong \frac{4 \cdot \pi^5 \cdot \left[\left(\frac{b/\lambda}{b/a}\right)^2 - \left(\frac{b}{\lambda}\right)^2\right]^2}{3 \cdot \eta \cdot \ln^2\left(\frac{b}{a}\right)}, \quad (15)$$

and $$B_r \cong \frac{16 \cdot \pi \cdot \left(\frac{b/\lambda}{b/a} - \frac{b}{\lambda}\right)}{\eta \cdot \ln^2\left(\frac{b}{a}\right)} \cdot \left[ E\left(\frac{2\sqrt{\frac{b}{a}}}{1 + \frac{b}{a}}\right) - 1 \right], \quad (16)$$

where $$E(x) = \int_0^{\frac{\pi}{2}} \sqrt{1 - x^2 \cdot \sin^2(\theta)} \cdot d\theta$$

is the complete elliptical integral of the second kind. The line integral of the electric field from the center conductor 1506 to the outer conductor 1502 will give this potential difference $V_{ab}$, across this shunt admittance as:

$$V_{ab} \Big|_{\beta z = \pi/4} \int_{a \to b} E_r = \frac{V_0 \cdot \ln\left(\frac{b}{a}\right)}{2 \cdot \pi}. \quad (17)$$

The power going to radiation, $P_{rad}$, and the energy stored, $U_{rad}$, are then $$P_{rad} = \frac{1}{2} G_r \cdot V_{ab}^2 = \frac{V_0^2 \cdot \pi^3 \cdot \left(\frac{b}{\lambda}\right)^4 \cdot \left[\left(\frac{b}{a}\right)^2 - 1\right]^2}{6 \cdot \eta \cdot \left(\frac{b}{a}\right)^4}, \quad (18)$$

and $$U_{rad} = \frac{1}{4} \cdot \frac{B_r}{\omega} \cdot V_{ab}^2 = \frac{\varepsilon \cdot V_0^2 \cdot \lambda \cdot \left(\frac{b}{\lambda}\right) \cdot \left(\left(\frac{b}{a}\right)^{-1} + 1\right)}{2 \cdot \pi^2} \cdot \left[ E\left(\frac{2\sqrt{\frac{b}{a}}}{1 + \frac{b}{a}}\right) - 1 \right]. \quad (19)$$

The overall Q of the cavity 1512 including radiation can then be expressed as:

$$Q = \frac{\omega \cdot (U + U_{rad})}{P_{ctr} + P_{out} + P_b + P_{\sigma_e} + P_{rad}} \cong \frac{\omega \cdot (U)}{P_{ctr} + P_{out} + P_b + P_{\sigma_e} + P_{rad}}. \quad (20)$$

Figure 16:
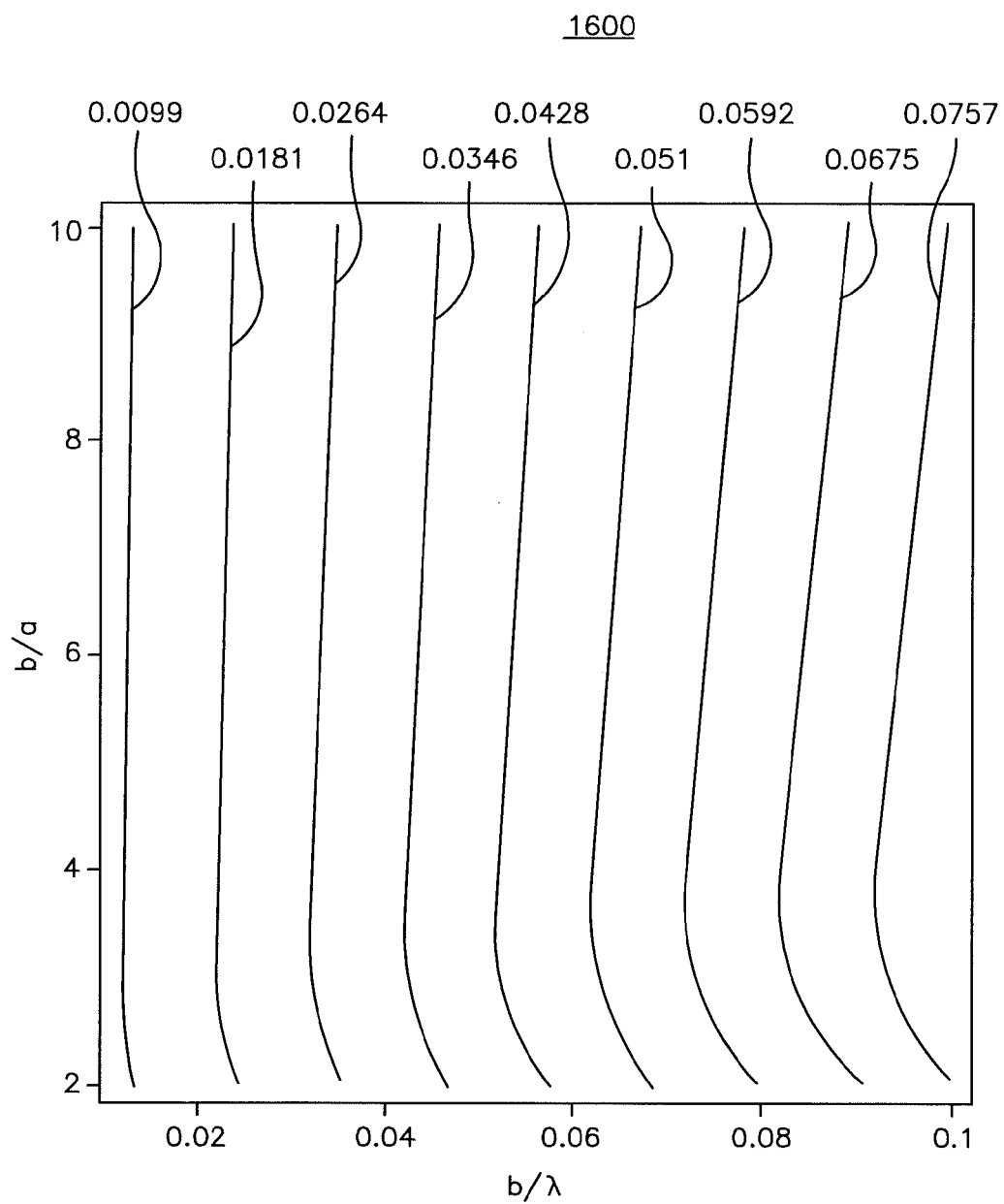
FIG. 16 illustrates a contour plot of the ratio of internal to external stored energy.
Figure 17:
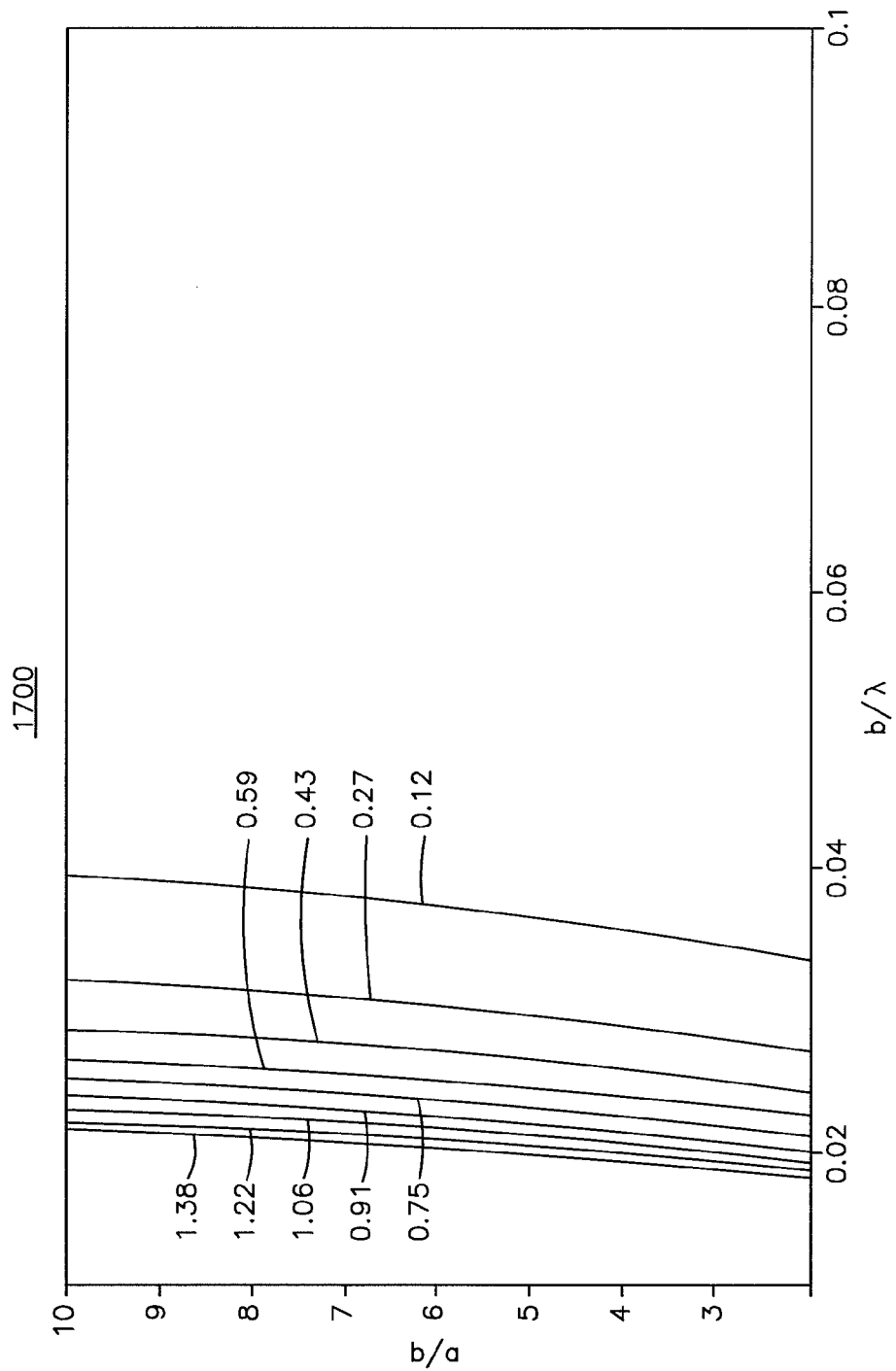
FIG. 17 illustrates a contour plot of Qrad.
Figure 18:
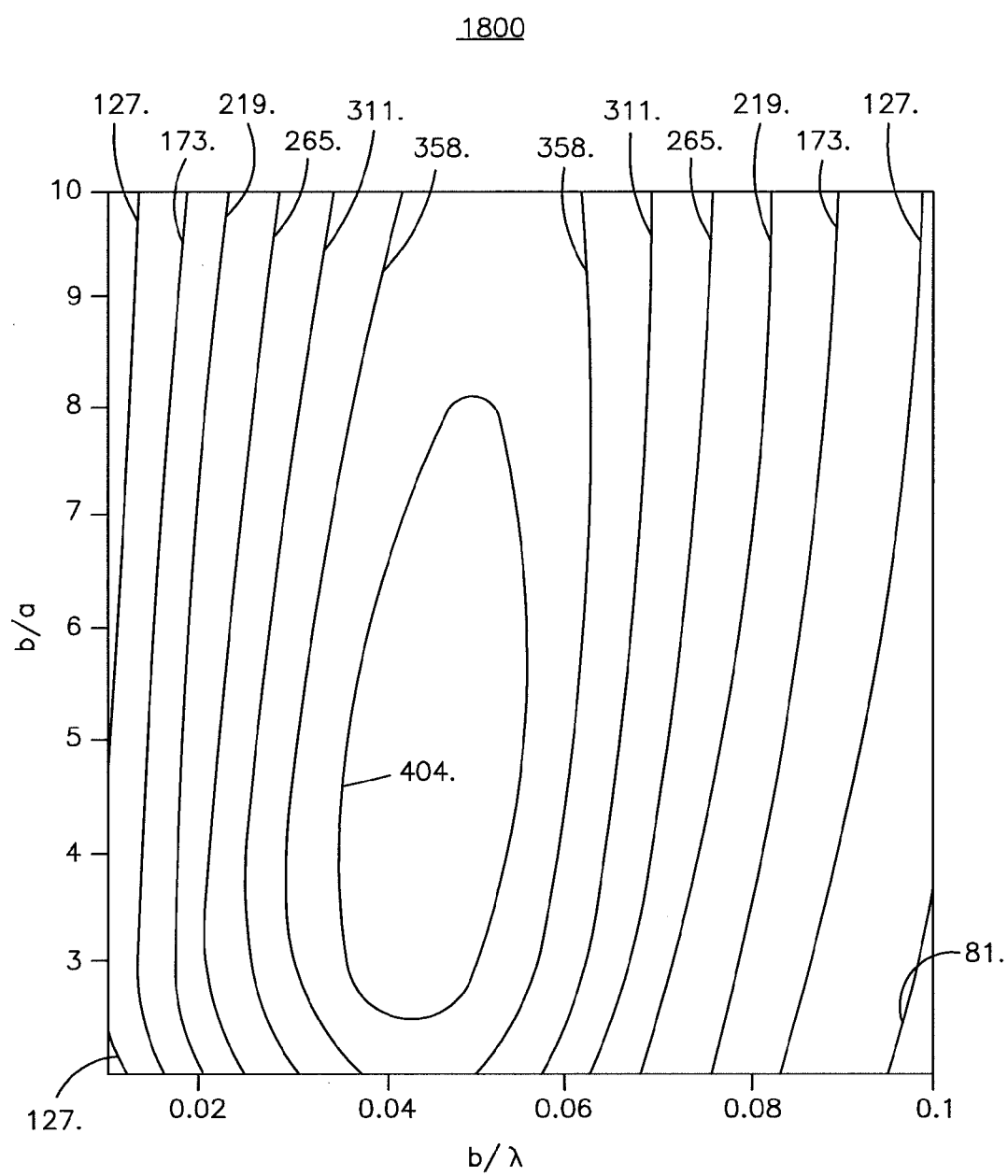
FIG. 18 illustrates a contour plot of the Q/2 for brass at 2.45 GHz using an air dielectric.
Figure 19:
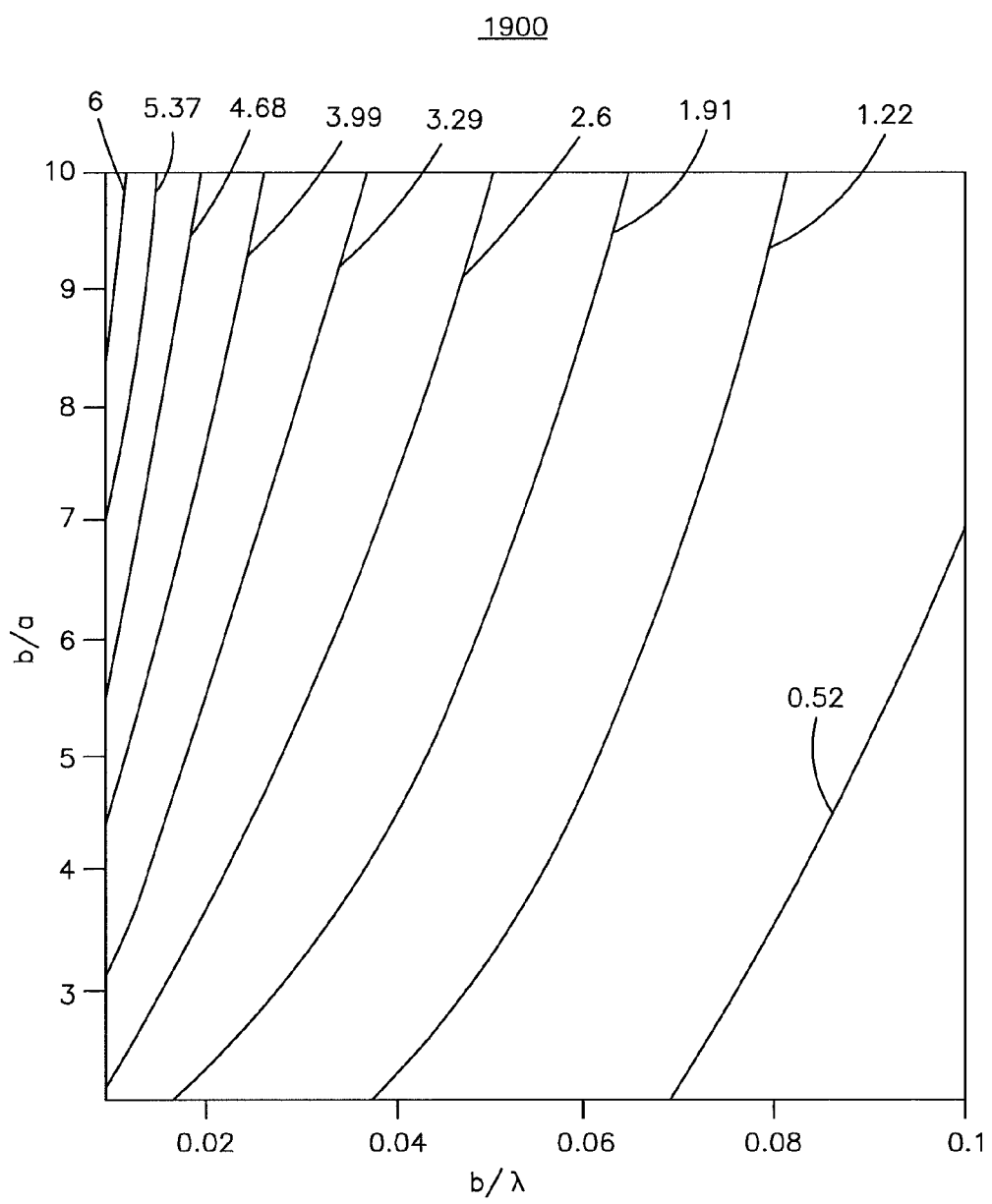
FIG. 19 illustrates a contour plot of Ea in (kV cm-1 W-½) for brass at 2.45 GHz using an air dielectric.

If the energy stored in the radiation susceptance, $U_{rad}$, is small compared to the energy stored in the interior of the cavity 1512, U, $P_{rad}$, are treated just like the previous losses. FIG. 16 illustrates a contour plot 1600 of the ratio of these stored energies, $U_{rad}/U$, with respect to the geometry terms $b/a$ and $b/\lambda$. FIG. 16 illustrates that the stored energy in the external near field is small, compared to the storage inside the cavity 1512, especially for a small $b/\lambda$, which avoids higher resonance modes.

A quality factor radiation component of, $Q_{rad}$, can then be defined as $$Q_{rad} = \frac{\omega \cdot U}{P_{rad}} = \frac{3 \cdot \left(\frac{b}{a}\right)^4 \cdot \ln\left(\frac{b}{a}\right)}{8 \cdot \pi^3 \cdot \left(\frac{b}{\lambda}\right)^4 \cdot \left[\left(\frac{b}{a}\right)^2 - 1\right]^2}. \quad (21)$$

To minimize the losses due to radiation, b/λ, should be made small and b/a kept close to unity; however, as is seen from a contour plot of $Q_{rad}$ in equation (21), b/λ is the dominant parameter. The total Q of the QWCCR 1500 can then be approximated by $$Q \cong \left( \frac{8 \cdot \pi^3 \cdot \left(\frac{b}{\lambda}\right)^4 \cdot \left[\left(\frac{b}{a}\right)^2 - 1\right]^2}{3 \cdot \left(\frac{b}{a}\right)^4 \cdot \ln\left(\frac{b}{a}\right)} + \frac{R_s}{2 \cdot \pi \cdot \eta} \left[ \frac{\left(\frac{b}{a}+1\right)}{\frac{b}{\lambda} \cdot \ln\left(\frac{b}{a}\right)} + 8 \right] + \tan(\delta_e) \right)^{-1} \quad (22)$$

The Q for each embodiment will depend on the ratio of the cavity 1512 filling's intrinsic impedance to the surface resistance, $R_s/\eta$. Contour plots 1600 of the loaded quality factor, $Q_{\Gamma=0}$, under perfect coupling and the associated tip electric fields per square-root of power are given for brass at 2.45 GHz below in the contour plot 1700 of FIG. 17 and contour plot 1800 of FIG. 18. Note that $Q_{\Gamma=0}$ is half the value given by equation (22). As these figures show, maximum Q does not coincide with maximum tip 1516 electric field, and in one embodiment the radius of the center conductor 1506 is small in order to achieve a high enough electric field for breakdown. Once breakdown does occur, the energy stored in the cavity 1512 will be dumped into the plasma, and as such, a larger Q would be desirable. Q also plays a role in the time it takes a cavity 1512 to fill its energy store and for the electromagnetic fields to build up.

Cavity Ringup and Energy Storage

The resonant QWCCR 1500 constitutes a second order system much like an RLC with a characteristic equation:

$$s^2 + \frac{R}{L}s + \frac{1}{L \cdot C} = s^2 + 2 \cdot \zeta \cdot \omega_n \cdot s + \omega_n^2 = s^2 + \frac{\omega_n}{Q} \cdot s + \omega_n^2, \quad (23)$$

with the natural resonance frequency $\omega_n$, the damping coefficient of $\zeta$, and s, the usual frequency domain variable. This highlights the direct relationship between Q and the damping coefficient $\zeta$ as $Q^{-1}=2\zeta$. It is well known that the time domain response of a second order system has a transient portion that decays exponentially with a time constant $(\zeta\omega)^{-1}$ or 2 Q/ω. After 5 time constants, these transients are generally considered to have died out, the cavity 1512 will be filled with energy and the fields will have reached a steady state value. The energy stored in the cavity 1512 is determined by solving equation (5) for $U=P_L \cdot Q/\omega$. Further equations would include coupling coefficients and times dependences.

A QWCCR 1500 at 2.45 GHz with Q of 100 would take 65 ns to ring up, fast enough even for proper ignition timing of higher speed engines. The energy accumulated would only be 6.5 μJ per 1 kW input power. If 0.2 mJ is assumed as a minimum for ignition, and with typical ignition energies much higher than that, energy stored in the cavity 1512 will only be a minor contributor toward ignition. The bulk of the ignition energy will come from the power fed to the cavity 1512 after breakdown.

Analysis Results

The preceding approximate analysis reveals the following factors to consider when designing the geometry of a QWCCR 1500 with a large tip 1516 electric field. The parameter of highest significance is a small center conductor 1506 radius, a, possibly sharpened, as $E_a$ is directly inversely proportional to a. It is desirable to maximize the term η Q $P_L$, on which $E_a$ depends in the square root. This requires keeping the intrinsic impedance, η, of any filler material high, feeding the QWCCR 1500 resonator as much power, $P_L$, as possible and maximizing Q. The latter is accomplished by increasing the volume energy storage U of the cavity, and minimizing surface and radiation losses. Radiation losses are excessive for large b/λ and the ratio b/(λa) is almost on equal footing with the center conductor 1506 radius in increasing tip electric field. As b/λ shrinks, conductor surface 1502, 1504, 1506 plus dielectric losses are on equal footing with radiation losses. In this region, the particulars of the materials and the frequency need to be examined. In various embodiments, designs are accomplished by examining contour plot 1700 of FIG. 17 and contour plot 1700 of FIG. 18, and using these contour plots 1700, 1800 as design tools to approximate the values realized in practice.

Quarter Wave Coaxial Cavity Resonator Design and Implementation

In one embodiment, the QWCCR 1500 is created out of alloy 360 brass. An air dielectric is used and a design field strength requirement of greater than 30 kV cm$^{-1}$ is selected. Such field strength is sufficient to cause breakdown under atmospheric conditions. Using FIG. 19 and selecting a 100 W power input, the region of the contour plot 1900 indicating field strength greater than 3 kV cm$^{-1}$ W$^{-1/2}$ is identified. The QWCCR 1500 has a major diameter of ¼" or b/λ=0.026 and a minor diameter of 1/32" or b/a ratio of 8, corresponding to an estimated field strength of 3.5 kV cm$^{-1}$ W$^{-1/2}$ and a $Q_\Gamma$=0 of 270.

Figure 20:
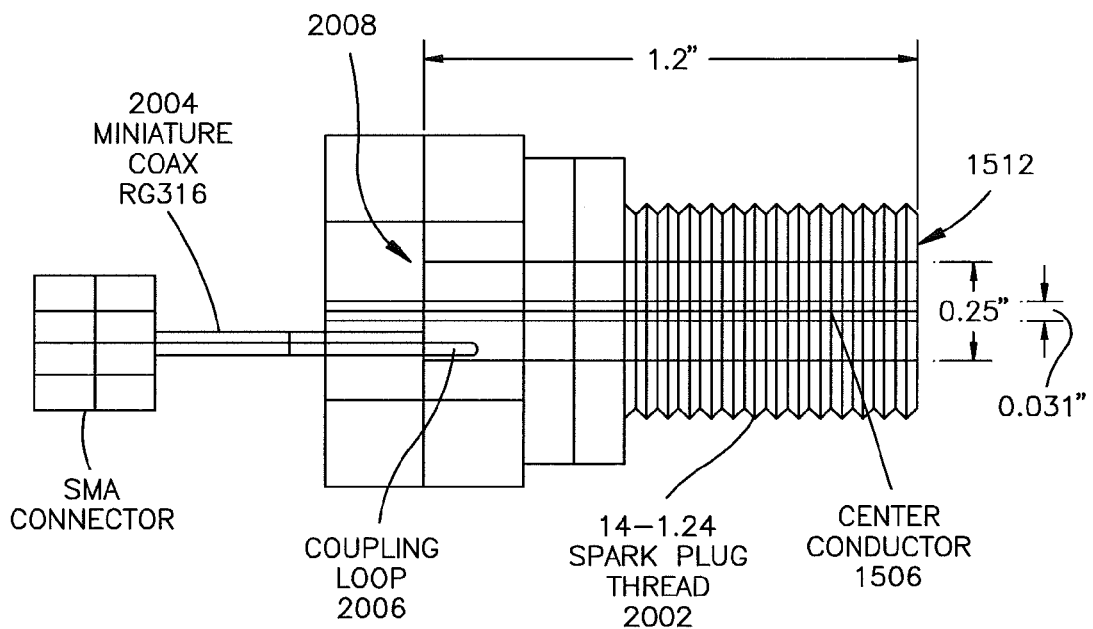
FIG. 20 illustrates a view of an exemplary QWCCR design and implementation.

FIG. 20 shows this embodiment of an exemplary QWCCR spark plug 2000 with a 14-1.25 mm spark plug thread 2002. The coaxial cable 2004 enters the base 2008 of the cavity 1512. The coupling is accomplished through a small loop 2006, created by the coaxial cable 2004 center conductor attaching back to the shield of the coaxial cable 2004. Proper impedance matching between the cavity 1512 and the coaxial cable 2004 is accomplished by rotating the coaxial cable 2004 thereby turning the plane of the small loop 2006. This adjusts the magnetic linkage between the fields in the base of the cavity 1512. Once a coupling close to 1:1 is achieved, for example by measuring with an HP8753D network analyzer, the coaxial cable 2004 is crimped and soldered in place. The achieved coupling and the loaded quality factor $Q_\Gamma$=0 is measured to be 258 at a resonant frequency of 2430.73 MHz. Note that the quality factor was somewhat lower than predicted by analysis.

Theoretical surface resistance is generally not achievable due to surface imperfections and contaminations, such as oxidation. The magnetic fields in the base 2008 of the cavity 1512 are slightly disturbed by the presence of the coupling structure, which increases the losses slightly. Soldering also created a small amount of lower conductivity surface around the base of the center conductor 1506. With a rounded tip 1516, the measured $Q_\Gamma$=0 of 253 is suitable for producing a field strength of 3.46 kV cm-1 W-½, or 34.6 kV cm$^{-1}$ at 100 W. To operate at the estimated 300 kV cm$^{-1}$ necessary under an engine's 10:1 compression ratio, in one embodiment the product η Q PL is increased by 100 according to equation (10). In another embodiment, the tip 1516 radius is reduced to 1/10 the initial diameter to intensify the field. In another embodiment, a gas temperature increase lowers this requirement per equation (2). In another embodiment, roughness surface imperfections on the tip 1516 of the center conductor 1506 will lower the threshold by concentrating the field.

Design Refinement

In various embodiments, the QWCCR 1500 is optimized by changes to the geometry to reduce radiation losses through the aperture, and by maintaining a high volume to interior surface area ratio. The disclosed theoretical analysis allows the prediction of cylindrical design performance using the derived equations and design graphs. In embodiments, the radius of the center conductor 1506 at the tip 1516 is chosen to cause breakdown at a given desired field strength, much like choosing appropriate gap spacing for a spark plug 106. In spark plugs 106 this allows energy to build up prior to the breakdown event; similarly the QWCCR 1500 with a larger exposed tip area creates plasma at breakdown, aiding in the ignition of the mixture. In embodiments, improvements in the QWCCR 1500 design are made through selection of low loss materials to improve the quality factor and the associated resonant field step-up to higher potentials.

Reduced Aperture Geometries

Figure 21A:
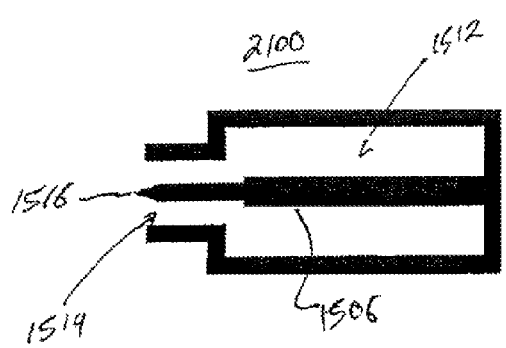
FIGS. 21a, 21b, 21c, and 21d illustrates views of exemplary QWCCRs having reduced aperture geometries.
Figure 21B:
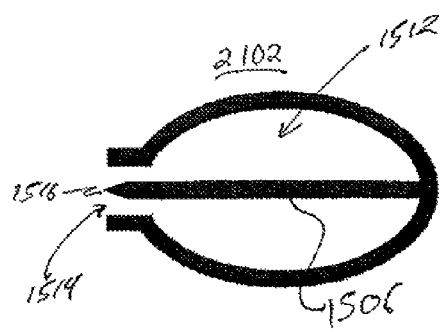
Figure 21C:
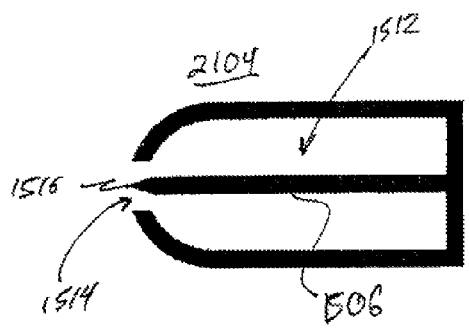
Figure 21D:
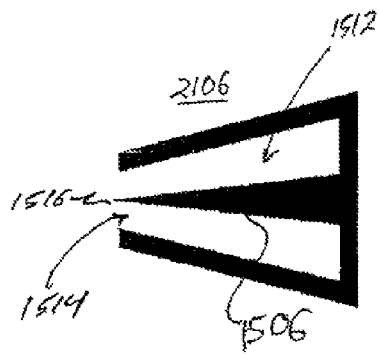

In embodiments, the QWCCR 1500 has a reduced aperture geometry, by narrowing the cavity 1512 near the opening 1514, or aperture. Pointed discharge tips 1516 at the end of the center conductor 1506 intensify and concentrate the electric fields. FIGS. 21*a*, 21*b*, 21*c*, and 21*d* illustrate several possible embodiments for a narrow aperture QWCCR 2100, 2102, 2104, 2106. The embodiment of FIG. 21*a* illustrates a QWCCR having a rectangular cavity with a stepped aperture 2100. The embodiment of FIG. 21*b* illustrates a QWCCR having an oval cavity with a narrow aperture 2102. The embodiment of FIG. 21*c* illustrates a QWCCR having a rectangular cavity with a curved aperture 2104. The embodiment of FIG. 21*d* illustrates a QWCCR having a tapered cavity with a narrow aperture 2106. These exemplary embodiments illustrate sample geometries of narrow aperture QWCCRs 2100, 2102, 2104, 2106. Various other configurations and geometries are possible as would be understood by one familiar in the art. Although the geometries of the above embodiments cause the resonant fields to be slightly distorted when compared to a cylindrical QWCCR 1500, the different geometries do not significantly affect the function of the narrow aperture QWCCRs 2100, 2102, 2104, 2106. However, one particular result of the closer proximity of the center and outer conductors at the opening 1514, or aperture, is an additional reactive or capacitive loading. The additional reactive loading tends to decrease resonance frequency slightly, and also makes the effective length of the narrow aperture QWCCRs 2100, 2102, 2104, 2106 slightly shorter. Such reactive loading can be enhanced by other known methods that produce RF capacitance, for example by using enlarged metal tips 1516 having geometries such a spheroid-like shapes or teardrop-like shapes, or by placing dielectric materials around the tip. However, the effective length is not significantly shortened and the use of different shaped tips or dielectrics may not be practical for all applications.

Tapered Geometries

Figure 22A:
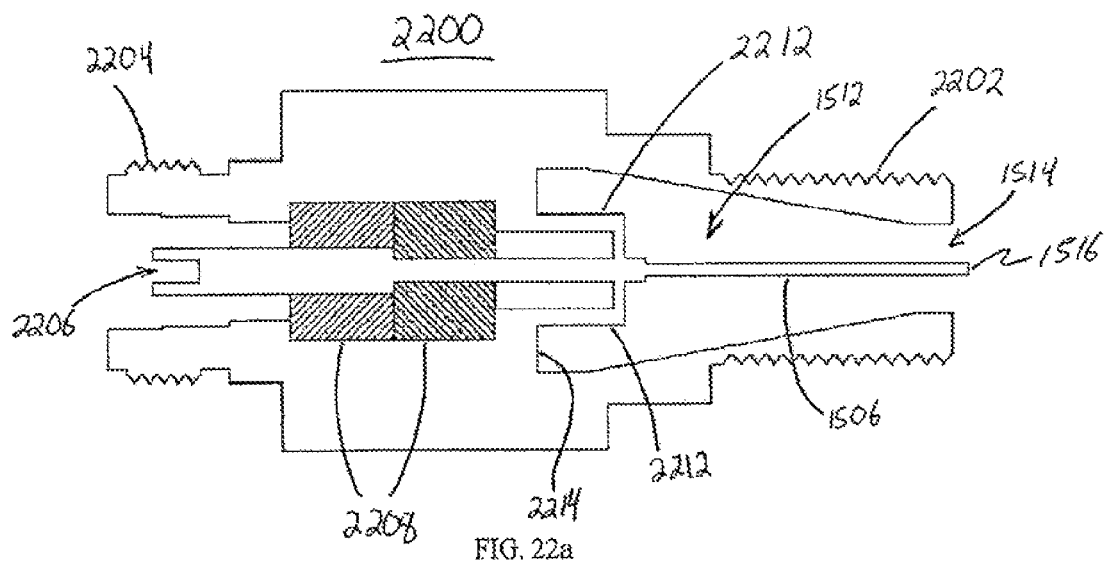
FIGS. 22a and 22b illustrate 2D and 3D views of an exemplary tapered QWCCR having threads for mounting in a combustion engine.
Figure 22B:
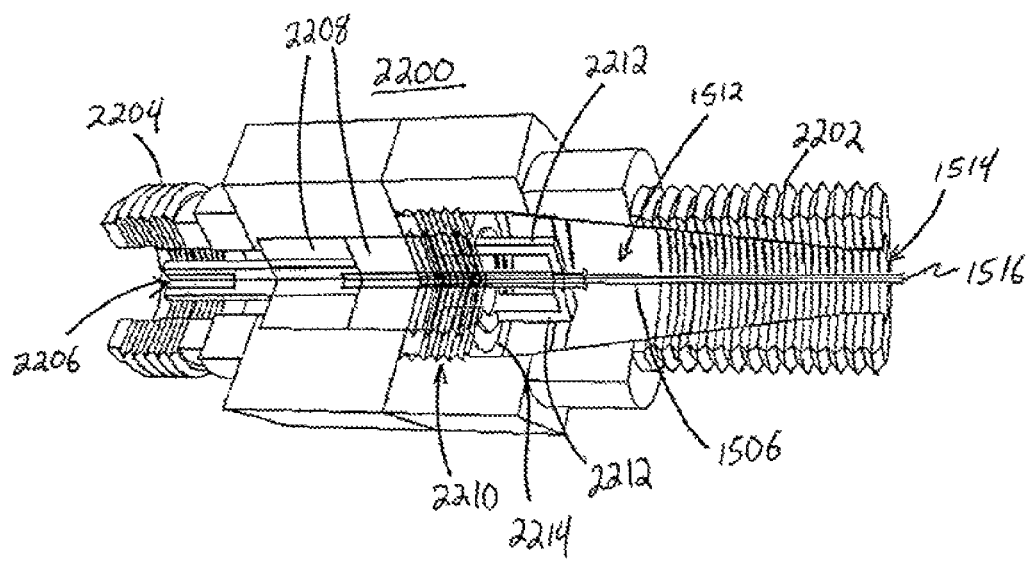

Referring now to FIGS. 22*a* and 22*b*, a threaded tapered QWCCR 2200 is illustrated. In FIG. 22*a*, the threaded tapered QWCCR 2200 is illustrated in two dimensions. In FIG. 22*b*, the threaded tapered QWCCR 2200 is illustrated in three dimensions. The threaded tapered QWCCR 2200 comprises a cavity 1512 that is tapered and a center conductor 1506 with a tip 1516 that extends through an opening 1514 in a front threaded connector 2202. The threads of the front threaded connector 2202 facilitate mounting the threaded tapered QWCCR 2200 to a combustion engine. A rear threaded connector 2204 accepts a threaded electrical connector (not shown) from an ignition control system; the threaded electrical connector mates with an electrical connector 2206 and passes the RF energy through dielectric seals 2208, shown as crosshatched regions in FIG. 22*a*, to dual on-axis inductive coupling loops 2212. The dual on-axis inductive coupling loops 2212 inductively couple the RF energy to the center conductor 1506. Internal threaded portions 2210 facilitate assembly of the QWCCR 2200. In an embodiment, the rear threaded connector 2204 and electrical connector 2206 accept a 50 Ohm coaxial connector.

The dielectric seals 2208 are placed towards the rear, or base 2214, of the threaded tapered QWCCR 2200 to prevent losses to the electric field near the center conductor 1506 and tip 1516. Tapering the cavity 1512 and narrowing the opening 1514, or aperture, increase the electric field at the tip 1516 by squeezing the electric field into a smaller radial extent. Maintaining a larger diameter in the cavity 1512 near the base 2214 of the threaded tapered QWCCR 2200 helps to reduce conduction losses, thereby allowing a high Q, as it allows the resonant magnetic field to spread-out and have a lower valued tangential component at the surface of the conductors such as the base 2214 and center conductor 1506.

The threaded tapered QWCCR 2200 advantageously reduces aperture radiation losses by keeping the aperture size, or opening 1514, small relative to the operating wavelength, $\lambda$, or stated another way, by keeping the size of the aperture, or opening 1514, small in relation to the length of the cavity 1512. The length of the cavity 1512 is advantageously chosen as $\lambda/4$ although larger odd multiples of $\lambda/4$ could also be used. However, if the length of the cavity 1512 is longer than $\lambda/4$ then undesirable conduction losses may occur, depending on the geometry of the cavity 1512, for example through the greater surface area of the cavity wall due to the surface resistance, $R_S$. Although larger cavity 1512 may increase Q, greater surface areas may lower Q, especially for surfaces areas where the magnetic field strength is highest. Therefore, to reduce conduction losses, the threaded tapered QWCCR 2200 utilizes a $\lambda/4$ cavity 1512.

In an embodiment, the threaded tapered QWCCR 2200 is designed to replace an existing spark plug 106. Using a $\lambda/4$ cavity 1512 that is comparable to the length of a spark plug, for example 3 cm, results in an operating frequency, $\lambda$, of approximately 2.45 Ghz. However, there are disadvantages to using this high of an operating frequency, $\lambda$. High frequency generators can sometimes be more expensive than lower frequency generators, depending on the operating frequency, $\lambda$. Also, conduction losses in the cavity 1512 increase with operating frequency, $\lambda$. Therefore, using lower frequencies would advantageously increase the Q of the threaded tapered QWCCR 2200, and QWCCRs 1550 in general.

Several methods can be utilized to reduce the operating frequency, $\lambda$, without increasing the overall length of the cavity 1512. In an embodiment, the cavity 1512 can be filled with a dielectric. However filling the cavity 1512 with a dielectric has the disadvantage that the dielectric increases energy loss. In another embodiment, the cavity 1512 can utilize a folded geometry to increase the effective length of the cavity 1512 without increasing the overall length of the QWCCR 1550. In another embodiment, the QWCCR 1550 utilizes reactive loading of the cavity 1512. The folded cavity geometry and reactive loading methods are described below.

Folded Cavity Geometries

Figure 23A:
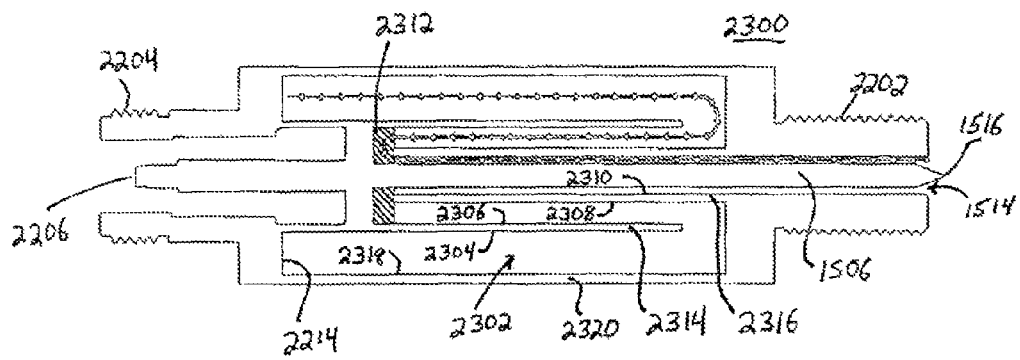
FIGS. 23a and 23b illustrate 2D and 3D views of an exemplary folded QWCCR having threads for mounting in a combustion engine.
Figure 23B:
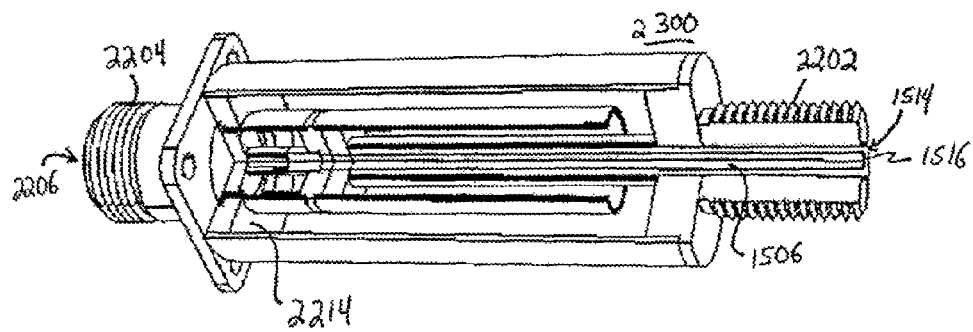

Referring now to FIGS. 23a and 23b, a threaded folded cavity QWCCR 2300 is illustrated. In FIG. 23a, the threaded folded cavity QWCCR 2300 is illustrated in two dimensions. In FIG. 23b, the threaded folded cavity QWCCR 2300 is illustrated in three dimensions. The threaded folded cavity QWCCR 2200 comprises a folded cavity 2302 that reduces the size of the resonator by folding, or nesting, concentric portions of the cavity 2302 on itself. The folded cavity 2302 achieves substantial reductions in the length of the threaded folded cavity QWCCR 2200 while maintaining the same resonant frequency of a longer QWCCR 1500. The folding, or nesting, of the folded cavity 2302 advantageously allows the threaded folded cavity QWCCR 2300 to have both a large diameter base 2214 and a small diameter aperture, or opening 1514. The large diameter of the base 2214 in the high magnetic field region reduces conduction losses, while the smaller diameter of the aperture, or opening 1514, concentrates the electrical field and reduces losses relating to aperture radiation.

To explain the function of the folded cavity 2302 of the threaded folded cavity QWCCR 2300, a resonant standing quarter wave can be thought of as two interfering waves bouncing back and forth between the electrically shorted base 2214 and the electrically open aperture, or opening 1514, of the folded cavity 2302. The path is illustrated in one direction using arrows in FIG. 23a. The folded cavity 2302 comprises an inner concentric hollow conductor 2316 and an outer concentric hollow conductor 2134. The inner concentric hollow conductor 2316 and the outer concentric hollow conductor 2134 serve dual roles as both inner and outer conductors of the resonator. The walls of sections of the folded cavity 2302 comprise the surfaces, 2304, 2306, of the inner concentric hollow conductor 2316, and the surfaces, 2308, 2310 of the outer concentric hollow conductor 2314.

Figure 23C:
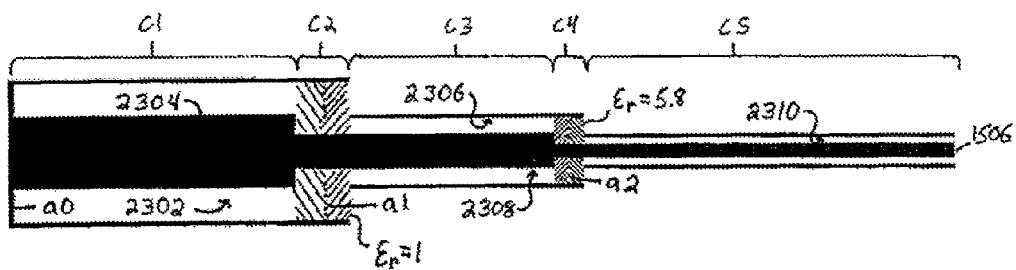
FIG. 23c illustrates an unfolded QWCCR for purposes of explaining features of a folded QWCCR.

The folded cavity 2302 reduces the physical length of the threaded folded cavity QWCCR 2300 to approximately one third of the size of an unfolded QWCCR 1500. Effectively, the folded cavity 2302 of the threaded folded cavity QWCCR 2300 behaves similarly to three joined pieces of coaxial transmission line with differing dimensions. This is illustrated in FIG. 23c, which shows the rough equivalent of the threaded folded cavity QWCCR 2300 if it were unfolded. The unfolded geometry has an end-to-end length that is close to multiple of a quarter wavelength, but not exactly realizable physically due to how the inner concentric hollow conductor 2316 and an outer concentric hollow conductor 2134 are connected. The dotted line illustrates the wave reflection point in the folded cavity 2302. In embodiments, additional concentric hollow conductors are utilized. In embodiments, the geometries of one or more of the concentric hollow conductors is altered from cylindrical to another geometry, for example a tapered geometry. In embodiments, there are an odd number of oppositely directed concentric hollow conductors in order to have the opening 1514 opposite the rear threaded connector 2204 and electrical connector 2206.

In an embodiment, the dimensions of the inner concentric hollow conductor 2316 and an outer concentric hollow conductor 2134 are selected to result in the same coaxial transmission line impedances to avoid impedance discontinuities other than the base 2214 and aperture, or opening 1514. Referring back to Equations (6) and (7), at resonance, the stored magnetic and electric time average energies are equal. The energy store per unit length is not directly dependent on the actual radii of the inner concentric hollow conductor 2316 and an outer concentric hollow conductor 2134, but instead are a function of their characteristic impedance, i.e., the radius ratio. Therefore the folded cavity 2302 will behave similarly to a longer unfolded cavity 1512 if the characteristic impedance of each section is maintained.

However, small washer shaped regions of potential impedance discontinuities exist at the transition points between the inner concentric hollow conductor 2316, the outer concentric hollow conductor 2134, and the wall 2320. In an embodiment, to eliminate or reduce the impedance discontinuities at the transition points, small washer shaped dielectric seals 2312 are placed at the transition points. In an embodiment, to eliminate or reduce the impedance discontinuities at the transition points, the radius or geometries of the center conductor are modified. Because the center conductor is a folded cavity 2302, the center conductor includes the surface 2304 of the outer concentric hollow conductor 2314, and the surface 2308 of the inner concentric hollow conductor 2316. Therefore the surfaces 2304, 2308 and concentric hollow conductors 2314, 2316 are altered slightly so that the transition points have the same characteristic impedances as the rest of the folded cavity 2302.

The transition regions may be short enough that corrective small washer shaped dielectric seals 2312 may not be necessary. The transition regions can be viewed as lumped reactive loads on the line. In an embodiment, small washer shaped dielectric seals 2312 are placed in the transition regions or other areas of the folded cavity 2302. The dielectric seals 2312 also function as seals for the folded cavity 2302 to prevent materials from the combustion chamber, or other contaminants, from entering the folded cavity 2302. Because the threaded folded cavity QWCCR 2300 will become hot from contact with the combustion chamber and hot gases, the small washer shaped dielectric seals 2312 are kept short to prevent any difference in their thermal expansion rate from creating physical stresses on the inner concentric hollow conductor 2316 or the outer concentric hollow conductor 2134. The small washer shaped dielectric seals 2312 are also kept short to prevent losses in the dielectric material. Note that in some placements of a dielectric seals 2312, such as when sandwiched between cavity members 2314, 2316, 2320, a standing RF wave will pass through the same dielectric seal 2312 twice, once when the standing wave is travelling in a first direction, and then again as it is reflected in the other direction. In such situations, the dielectric seal 2312 will have the same effect as a dielectric seal 2312 that is twice as thick.

Whereas a single unfolded cavity generally uses the same material along the entire length of the cavity 1512, the folded cavity 2302 can utilize different materials for the wall 2320, the inner concentric hollow conductor 2316, and the outer concentric hollow conductor 2314, collective the cavity members 2314, 2316, 2320. In embodiments, one or more conductor materials are used for the wall 2320, the inner concentric hollow conductor 2316, and the outer concentric hollow conductor 2134. In embodiments, the surfaces 2304, 2306, 2308, 2310, 2318 comprise different materials. For example, where high conductivity is important, for example the high magnetic field regions of the base 2214, copper can be selected as the material. In high temperature regions, such as the tip 1516, more resilient conductive material can be selected. Selection of different materials advantageously allows the designer to use expensive materials sparingly The threaded folded cavity QWCCR 2300 also has a center conductor 1506 with a tip 1516 that extends through an opening 1514 in a front threaded connector 2202. The threads of the front threaded connector 2202 facilitate mounting the threaded folded cavity QWCCR 2300 to a combustion engine. A rear threaded connector 2204 accepts a threaded electrical connector (not shown) from an ignition control system; the threaded electrical connector mates with an electrical connector 2206.

Analysis of Power Losses in Folded Cavity Geometries

The energy store per unit length is a function of the cavity member's 2314, 2316, 2320 characteristic impedance, however the nesting of the cavity members 2314, 2316, 2320 create sections of different sizes rather than a more uniform cavity 1512. The losses in the folded cavity 2302 will therefore be somewhat different than a more uniform cavity 1512. Assuming that field fringing at the transition regions is negligible, and that the fields of the resonance are approximately transverse electromagnetic mode (TEM) standing quarter wave sinusoids so that equations (3) and (4) describe the waves, $\beta = 2/\lambda$, and $I_0$ is some assumed amplitude. For a cylindrical conductor surface, with surface resistance $R_s$, and radius $r_o$, the time average power dissipated is given by the surface integral in equation (11) and equation (2) can be recast in terms of electrical angles so that $\beta \cdot dz = d\theta_z$:

$$P_{cyl} = \frac{R_s}{2} \int_A |H_{//}|^2 \cdot dA \qquad (24)$$

$$P_{cyl} = \frac{I_o^2 \cdot R_s}{4 \cdot \pi \cdot \beta \cdot r_o} \cdot \int_{\theta_{z1}}^{\theta_{z2}} \cos^2(\theta_z) \cdot d\theta_z$$

Considering an area interpretation of the integral over $\cos^2 \theta$, it can be seen that losses per unit length decrease as the open end of the cavity is approached. This suggests that using large radii toward the short circuited end of the resonant line is more important in reducing losses than using them toward the open circuited end. If constant power dissipation per unit length is desired, the radii could vary as $r_o \cdot \cos^2 \theta$ resulting in a tapered shape. The sidewall surface loss of (10) would then reduce to $$P_{cos^2} = \frac{I_o^2 \cdot R_s}{4 \cdot \pi \cdot \beta \cdot r_o} \cdot \Delta \theta_z \qquad (25)$$

Through a similar area integration the ohmic power losses for a circular annulus with inner and outer radius a' and b respectively, at a distance z along the line is determined as:

$$P_{anu} = \frac{I_o^2 \cdot R_s}{4 \cdot \pi} \cdot \ln(b/a') \cdot \cos^2(\theta_z) \qquad (26)$$

Placing annuli close to the short circuited end of the transmission line, where the magnetic fields are higher, will result in larger losses. The power dissipated by the standing wave in a low loss dielectric filling, with effective conductivity, $\sigma_e = \omega \cdot \in \cdot \tan \delta$, in the coaxial line with inner radius, a, and outer radius, b, extending between distances $z_1$ and $z_2$ along the line is $$P_{\sigma_e} = \frac{\sigma_e}{2} \int_{Vol} |E|^2 \cdot dv \qquad (27)$$

$$P_{\sigma_e} = \frac{1}{2} \cdot I_o^2 \cdot Z_o \cdot \tan(\delta) \cdot \int_{\theta_{z1}}^{\theta_{z2}} \sin^2(\theta_z) \cdot d\theta_z$$

for the sinusoidal resonant field distribution. Considering the integral over $\sin^2 \theta$ in equation (27), the closer a dielectric filling is placed to the open end of the resonator, the higher the losses will be. The quality factors, Q, of the resonator can now be estimated as $$Q = \left( \sum_i \frac{P_i}{\omega \cdot U} \right)^{-1} \qquad (28)$$

Prior to analyzing any design, the section lengths of the resonator have to be converted to electrical degrees so the integrals can be evaluated. The dielectric constant of the transition regions will affect the angular electrical line length. The relative dielectric constant required to maintain the same line impedance when the conductor radius ratio changes from $b_0/a_0$ to $b_1/a_1$ is given by:

$$\varepsilon_r = \left[ \frac{\ln(b_1/a_1)}{\ln(b_0/a_0)} \right]^2 \qquad (29)$$

Despite having the largest radii, the wall 2120 contributes the greatest losses because it experiences the strongest magnetic fields. Therefore keeping the cavity members 2314, 2316, 2320 short will help the Q or quality of the threaded folded cavity QWCCR 2300. Further, improvements to the threaded folded cavity QWCCR 2300 can be made by increase the radii. However, the radii cannot be increased beyond the point where higher order harmonics, or modes, start to appear in the threaded folded cavity QWCCR 2300. This suggests an upper limit of $2\pi(b+a) < \lambda/2$ for the radii. This suggests that a high Q folded QWCCR can be created by increasing the radii.

High Q Folded QWCCR

Figure 24A:
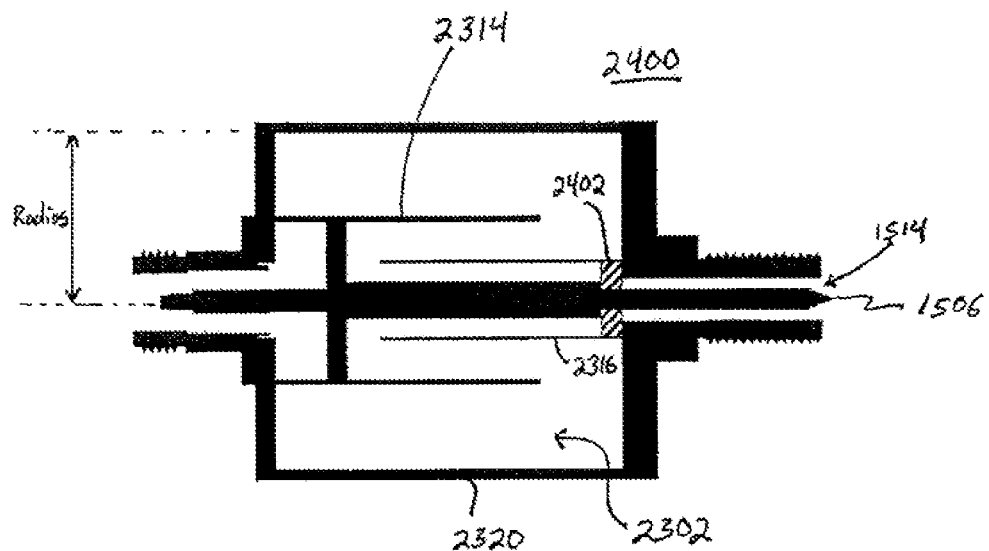
FIGS. 24a and 24b illustrate views of high Q folded QWCCRs having shortened geometries.
Figure 24B:
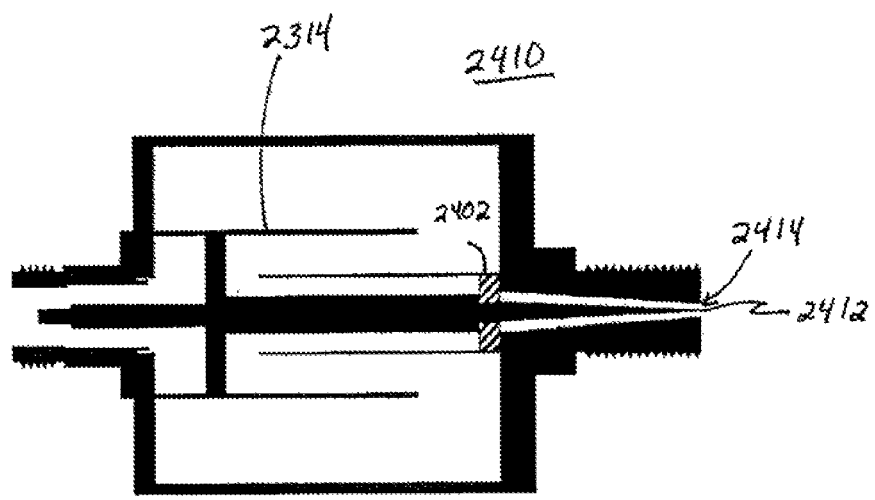

Referring now to FIGS. 24a and 24b, a high Q folded QWCCR 2400, and a high Q folded tapered QWCCR 2410 are presented. The quality factor, or Q, of a folded cavity 2302 is increased by choosing larger radii for the wall 2320, the inner concentric hollow conductor 2316, and the outer concentric hollow conductor 2134. Although the radii is increased for the folded cavity 2302, the opening 1514 or aperture remains narrow due to the folded design, thus preventing significant radiative losses through the opening 1514. In embodiments, a dielectric plug 2402, or dielectric seal, prevents material from the combustion chamber from entering the folded cavity 2302. In FIG. 24b, the high Q folded tapered QWCCR 2410 additionally has a tapered discharge electrode 2412 and a tapered opening 2414.

QWCCR with Helical Reactive Loading

Figure 25A:
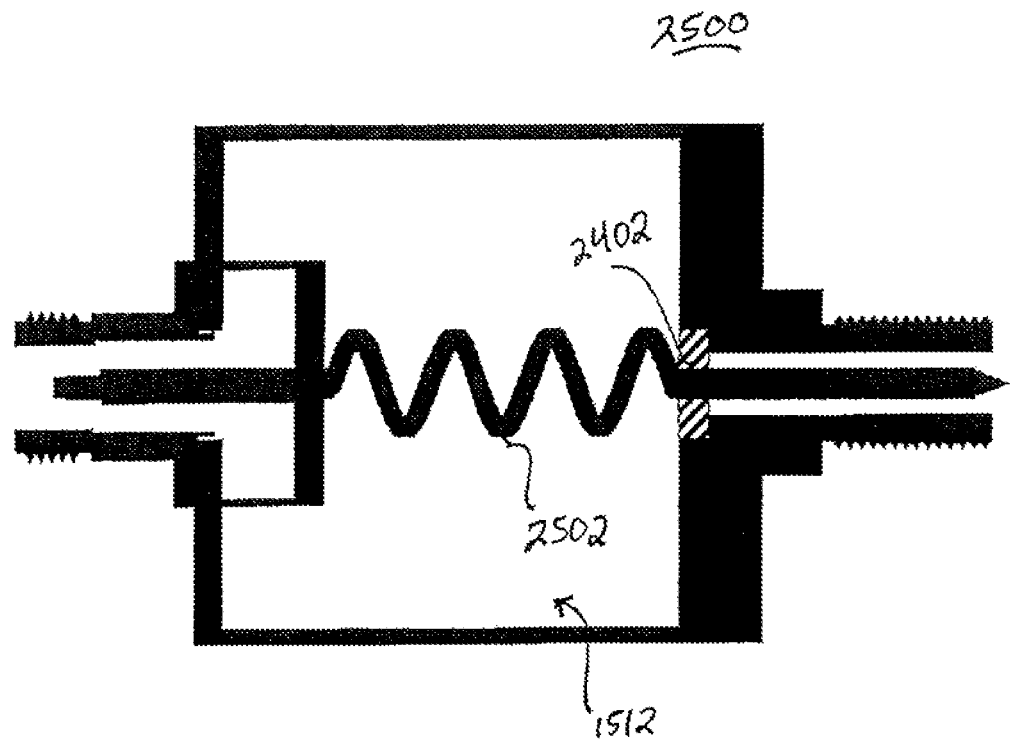
FIGS. 25a and 25b illustrate views of folded QWCCRs having helical reactive loading.
Figure 25B:
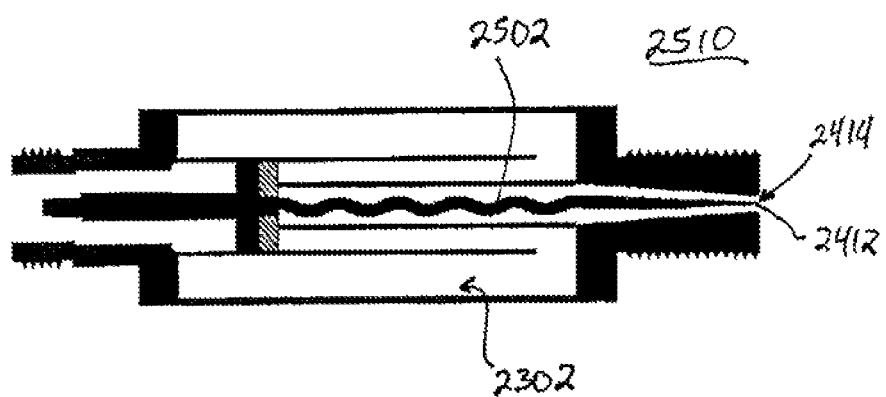

Referring now to FIGS. 25a, and 25b, a QWCCR with helical reactive loading 2500 and a folded QWCCR with helical reactive loading 2510 are presented. The QWCCR with helical reactive loading 2500 is similar to QWCCR 1500 but further comprises a helical center conductor 2502. Reactive loading using a helical center conductor 2502 decreases the necessary physical length of the cavity 1512 for a given resonance frequency and also boosts the stored energy. Such reactive loading reduces the size and speed of electromagnetic waves and devices that use reactive loading, such as traveling wave tubes, are therefore referred to as slow wave devices or reactively loaded lines. In embodiments, the QWCCR with helical reactive loading 2500 uses helical devices such as helical center conductors 2502, corrugated conductors, conductors with periodic structures and geometries, and dielectrically coated conductors. A dielectric plug 2402 prevents material from the combustion chamber from entering the cavity 1512. Referring now to FIG. 25, a folded QWCCR with helical reactive loading 2510 similarly uses a helical center conductor 2502 along with a folded cavity 2302, a tapered discharge electrode 2412, and a tapered opening 2414.

Experimental Testing

For an initial test case, the structure shown in FIG. 23c was assembled out of commercially available brass tubing sizes targeting a resonance frequency of 433 MHz (69.3 cm wavelength) with dimensions c1, c2, c3, c4, and c5 as given in Table I and Table II:

TABLE I

Dimension and properties of coaxial line sections

| Coax | c1 | c2 | c3 | c4 | c5 |
|---|---|---|---|---|---|
| b[cm] | 1.19 | 1.19 | 0.57 | 0.57 | 0.24 |
| a[cm] | 0.64 | 0.30 | 0.30 | 0.13 | 0.13 |
| $\epsilon_r$ | 1 | 1 | 1 | 5.8 | 1 |

TABLE I-continued

Dimension and properties of coaxial line sections

| Coax | c1 | c2 | c3 | c4 | c5 |
|---|---|---|---|---|---|
| $\tan(\delta)$ | 0 | 0 | 0 | .005 | 0 |
| $Z_o[\Omega]$ | 38 | 82 | 38 | 38 | 37 |
| $\Delta z$[cm] | 4.90 | 1.11 | 3.53 | 0.53 | 6.51 |
| $\Delta\theta_z$ [°] | 25.5 | 5.8 | 18.3 | 6.7 | 33.8 |
| $Q_i$ | 1700 | 5400 | 1900 | 1900 | 2200 |
| $\Delta z\, Q_i$[cm$^{-1}$] | 8400 | 5800 | 6600 | 1000 | 14500 |

TABLE II

Dimensions and location of annuli

| Annulus | a0 | a1 | a2 |
|---|---|---|---|
| b[cm] | 1.19 | 1.19 | 0.57 |
| a'[cm] | 0.64 | 0.30 | 0.13 |
| z[cm] | 0.00 | 5.46 | 9.80 |
| $\theta_z$[°] | 0 | 28.4 | 53.0 |
| $Q_i$ | 30300 | 18000 | 34700 |

The value 0.0104Ω was used as the surface resistance, $R_S$, of brass at 433 MHz. Note that the impedance matching dielectric at the first junction, which should have had a relative dielectric constant of 4.7, was omitted. Provided the length of the mismatch is short with respect to wavelength, no serious reflections will occur, and instead the junction steps will appear as small shunt capacitances. The magnitude of these capacitances is on the order of 0.2 pF which is located in a region of relatively low electric field magnitudes. For the purpose of this analysis, this shunt capacitance will be ignored. The calculated combined unloaded quality factor is 414. This is about 2.5 times greater than if the resonator had been made out of the smallest diameter section, c5, for the entire length but naturally lower than if the larger diameters of section, c1, had been used throughout. It is apparent from the calculated $Q_i$, that the annuli losses are insignificant. However, the dielectric losses should not be discounted, despite the fact that the dielectric is set back from the maximum electric fields by 33.8°. Also of note is the fact that despite having the largest radii, the cylinders of the c1 section contribute the largest losses as it experiences the strongest magnetic fields. As a figure of merit, that can be used to compare the transmission line sections, $\Delta z\, Q_i$ was also computed. This metric highlights the dielectric losses.

A compact cavity with larger radii, comparable to FIG. 24a, but without the pointed tip 1506, was designed with dimensions given in Table III and Table IV:

TABLE III

Dimension and properties of coaxial line sections

| Coax | c1 | c2 | c3 | c4 | c5 | c6 | c7 |
|---|---|---|---|---|---|---|---|
| b[cm] | 2.53 | 2.53 | 1.19 | 1.19 | 0.56 | 0.56 | 0.28 |
| a[cm] | 1.27 | 0.60 | 0.60 | 0.28 | 0.28 | 0.16 | 0.16 |
| $\epsilon_r$ | 1 | 1 | 1 | 1 | 1 | 5.8 | 1 |
| $\tan(\delta)$ | 0 | 0 | 0 | 0 | 0 | .005 | 0 |
| $Z_o[\Omega]$ | 42 | 88 | 41 | 87 | 42 | 31 | 34 |
| $\Delta z$[cm] | 4.08 | 2.54 | 2.46 | 1.02 | 3.41 | 0.32 | 3.07 |
| $\Delta\theta_z$ [°] | 21.2 | 13.2 | 12.8 | 5.3 | 17.7 | 4.0 | 15.9 |
| $Q_i$ | 5000 | 5600 | 6500 | 38300 | 5400 | 3800 | 30200 |
| $\Delta z\, Q_i$ [cm$^{-1}$] | 20600 | 14200 | 16000 | 38900 | 18300 | 1300 | 92700 |

TABLE IV

Dimensions and location of annuli

| Annulus | a0 | a1 | a2 |
|---|---|---|---|
| b[cm] | 2.53 | 2.53 | 1.19 |
| a'[cm] | 1.27 | 0.60 | 0.28 |
| z[cm] | 0.00 | 5.35 | 9.58 |
| $\theta_z[°]$ | 0 | 27.8 | 49.8 |
| $Q_i$ | 33600 | 20500 | 12300 |

The calculated, combined unloaded quality factor for this second design is 834, twice the small radii design quality factor. Note that an additional reduction in radii in going from c5 to c7 (the dielectric plug seal 2402 being c6; the center conductor 1506 being c7) was included without a reversal in direction and without accounting for the annuli losses in the reduction as the losses on the annuli are very low, i.e. their $Q_s$ are very high.

As a comparison and using the same TEM assumptions, the quality factor of a $\cos^2(\theta)$ tapered, unfolded cavity of quarter wavelength using air as a dielectric was derived using:

$$E_a = \frac{\eta}{a_{tip}} \sqrt{\frac{2 \cdot Q \cdot P}{\pi^3 \cdot Z_o}} \tag{30}$$

$$U = \frac{I_o^2 \cdot Z_o}{16 \cdot f} \tag{31}$$

for the energy stored, equation (25) for the tapered side conductors and equation (26) for the base conductor annulus at the shorting end. The result without accounting for the dielectric is given by:

$$Q_{\cos^2} = \left[ \frac{\lambda \cdot R_s}{2 \cdot \pi^2 \cdot Z_o} \cdot \left( \frac{1}{a} + \frac{1}{b} \right) + \frac{4 \cdot R_s}{\pi \cdot \eta} \right]^{-1} \tag{32}$$

The dielectric losses increase dramatically toward the open-circuited end of the cavity in such a tapered design since the $\sin^2(\theta)$ term under the integral in equation (27) is turned into a $\tan^2(\theta)$ term by the tapering:

$$P_{\sigma_e} = \frac{\omega \cdot \varepsilon \cdot \eta^2 \cdot I_o^2}{4 \cdot \pi} \cdot \int_{z1}^{z2} \int_a^b \frac{\sin^2(\beta \cdot z)}{r \cdot \cos^2(\beta \cdot z)} \cdot dr \cdot dz \tag{33}$$

$$P_{\sigma_e} = \frac{1}{2} \cdot I_o^2 \cdot Z_o \cdot \tan(\delta) \cdot \int_{\theta_{z1}}^{\theta_{z2}} \tan^2(\theta_z) \cdot d\theta_z$$

In an actual implementation, the length would be slightly shorter than $\lambda/4$, to allow an aperture that would have capacitance. Nevertheless, filling the entire cavity would create excessive losses. Since the previous two example cavities were mostly hollow, the tapered cavity will be assumed to be made of brass with an air dielectric throughout. The resulting quality factors of the tapered design using the same radii at the shorted base as the two sectioned cavities are: 418 for the initial and 927 for the enlarged radii respectively. These values are quite similar to the values calculated for the discretely sectioned designs; depending on how well the step tapered sections fit the $\cos^2(\theta)$ distribution, a first cut estimate of a sectioned design could be obtained using the tapered results. One could also construct such a tapered cavity by approximate the $\cos^2(\theta)$ taper with a straight line, thereby making a conical similar to FIG. 22a.

Measurement of the quality factor and the degree of coupling on a HP8753D network analyzer resulted in an unloaded Q of 340 at a resonance frequency of 425.75 MHz for the small radii geometry. The larger radii geometry resulted in an unloaded Q of 760 with a resonance frequency of 439.87 MHz. A conical brass resonator was constructed having a base radius of 1.5" and a b/a ratio of 6 for an approximate line impedance of 108Ω. The resonance frequency of the conical brass resonator had been measured at 960 MHz with an unloaded Q of 1800. Calculations using the $\cos^2(\theta)$ taper results would predict a quality factor of 2100, with a 17% difference from the conical measured result. For the folded cavities constructed, the frequencies of the implementations of the first and second cavity differ from the design frequencies by 1.7% and 1.6% respectively. As is generally the case, the measured quality factors were both lower than the theoretically calculated values. The respective differences for the small and large radii cavities were 18% and 9%. Note that disturbance of the electromagnetic fields at the base of the cavity due to the coupling structure have been ignored in the analysis. There is also potential for error due to conductivity differences, surface imperfections, solder joints and uncertainty in the dielectric parameters.

CONCLUSION

The numerous embodiments described above are applicable to a number of different applications. The embodiments of the QWCCR produce large and controllable sustained average power levels compared to conventional spark plug systems. Sustained high power levels are beneficial for ignition of ultra lean mixtures leading to higher combustion efficiencies and the associated fuel-savings. The QWCCR achieves a step-up of the energy to a potential necessary for breakdown without the inefficiencies of a conventional ignition coil. QWCCR embodiments utilizing reduced aperture geometries reduce radiative losses without significantly reducing resonant characteristics thereby increasing the Q, or quality, of the QWCCR. QWCCR embodiments utilizing reactive loads and folded cavity geometries permit the use of lower operating frequencies and increase the Q of the QWCCR, thereby permitting the use of less expensive power supplies and increasing the amount of power that is transferred into the corona discharge plasma. Operation of the QWCCR with high power corona discharge plasma is beneficial for demanding combustion applications. Using corona discharge plasma as an ignition source in lieu of more traditional spark plug technologies has many additional applications apparent to one of ordinary skill in the art.

The embodiments of the invention shown in the drawings and described above are exemplary of numerous embodiments that may be made within the scope of the appended claims. It is contemplated that numerous other configurations of the disclosed system, process, and device for igniting combustible materials in combustion chambers may be created taking advantage of the disclosed approach. It is the applicant's intention that the scope of the patent issuing herefrom will be limited only by the scope of the appended claims.

What is claimed is:
1. A quarter wave coaxial cavity resonator, comprising:
   a plurality of concentric nested cavity members arranged to form a folded cavity, the plurality of concentric nested cavity members including an outer cavity member and an inner cavity member defining an aperture, said aperture having a radius that is less than a radius of said base outer cavity member; and a center conductor having a tip, at least a portion of said center conductor disposed in said folded cavity, wherein an RF corona is formed in a region near said tip of said center conductor when a sustained RF oscillation is produced in the quarter wave coaxial cavity resonator.

2. The quarter wave coaxial cavity resonator of claim 1, further comprising a threaded body surrounding said aperture and adapted to fit a spark plug socket.

3. The quarter wave coaxial cavity resonator of claim 1, further comprising a dielectric seal positioned about said center conductor.

4. The quarter wave coaxial cavity resonator of claim 1, wherein said tip has a cylindrical geometry.

5. The quarter wave coaxial cavity resonator of claim 1, wherein said tip has a spherical geometry.

6. The quarter wave coaxial cavity resonator of claim 1, wherein said tip has a curved geometry.

7. The quarter wave coaxial cavity resonator of claim 1, wherein said tip has a pointed geometry.

8. The quarter wave coaxial cavity resonator of claim 1, wherein said tip has a teardrop geometry.

9. The quarter wave coaxial cavity resonator of claim 1, further comprising a loop coupling to couple an energy shaping means to said center conductor of the quarter wave coaxial cavity resonator.

* * * * *